(12) United States Patent
Takiguchi et al.

(10) Patent No.: US 9,304,398 B2
(45) Date of Patent: Apr. 5, 2016

(54) DEVELOPING TREATMENT APPARATUS AND DEVELOPING TREATMENT METHOD

(71) Applicant: Tokyo Electron Limited, Tokyo (JP)

(72) Inventors: Yasushi Takiguchi, Koshi (JP); Taro Yamamoto, Koshi (JP); Yoshinori Ikeda, Koshi (JP); Koki Yoshimura, Koshi (JP); Yoshiki Okamoto, Koshi (JP); Masahiro Fukuda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 344 days.

(21) Appl. No.: 14/022,434

(22) Filed: Sep. 10, 2013

(65) Prior Publication Data

US 2014/0071411 A1    Mar. 13, 2014

(30) Foreign Application Priority Data

Sep. 13, 2012 (JP) .................................. 2012-201117
Aug. 5, 2013 (JP) .................................. 2013-162536

(51) Int. Cl.
*G03B 27/32* (2006.01)
*G03C 5/26* (2006.01)
*G03F 7/30* (2006.01)
*H01L 21/67* (2006.01)

(52) U.S. Cl.
CPC ............ *G03F 7/3021* (2013.01); *G03F 7/3092* (2013.01); *H01L 21/67017* (2013.01)

(58) Field of Classification Search
CPC ................ G03F 7/3021; G03F 7/3092; H01L 21/67017
USPC ....................... 355/27, 77; 430/434
See application file for complete search history.

(56) References Cited

U.S. PATENT DOCUMENTS

2009/0130614 A1\* 5/2009 Ookouchi ............. G03F 7/3021
                                                                        430/434
2012/0057861 A1\* 3/2012 Matsuoka ........... H01L 21/6715
                                                                        396/611

FOREIGN PATENT DOCUMENTS

JP        2012-054469 A    3/2012

\* cited by examiner

*Primary Examiner* — Colin Kreutzer
(74) *Attorney, Agent, or Firm* — Posz Law Group, PLC

(57) ABSTRACT

The present invention is a developing treatment apparatus for performing development by supplying a developing solution to a substrate having a front surface coated with a positive resist or a negative resist and then subjected to exposure wherein a movable cup is raised to introduce one of scattering developing solutions for the positive and negative resists into an inner peripheral flow path of a cup and the movable cup is lowered to introduce the other of scattering developing solutions for the positive and negative resists into an outer peripheral flow path of the cup, and the developing solution introduced into the inner peripheral flow path and the developing solution introduced into the outer peripheral flow path are separately drained.

11 Claims, 22 Drawing Sheets

(a)

(b)

(a)

(b)

(a)

(b)

DEVELOPING TREATMENT APPARATUS AND DEVELOPING TREATMENT METHOD

BACKGROUND OF THE INVENTION

1. Field of the Invention

The present invention relates to a developing treatment apparatus and a developing treatment method which supply a developing solution to a substrate such as a semiconductor wafer or the like to perform treatment thereon.

This application is based upon and claims the benefit of priority of the prior Japanese Patent Application No. 2012-201117, filed in Japan on Sep. 13, 2012, and Japanese Patent Application No. 2013-162536, filed in Japan on Aug. 5, 2013, the entire contents of which are incorporated herein by reference.

2. Description of the Related Art

In general, for example, in a photolithography process in a manufacturing process of a substrate such as a semiconductor wafer or the like, for example, a resist coating treatment of applying a resist solution onto the substrate to form a resist film, exposure treatment of exposing a predetermined pattern to the resist film on the substrate, a developing treatment of supplying a developing solution onto the substrate after the exposure treatment to develop the resist film on the substrate and so on are performed.

In the resist coating treatment, a positive resist solution that generates a pattern by removing a portion exposed during the developing treatment or a negative resist solution that generates a pattern by removing a portion not exposed during the developing treatment is used. The resist solutions are selectively used in consideration of a resolution required for generating the pattern, adhesion between the substrate and the resist solution, heat resistance of the resist solution and so on. Further, in the developing treatment, a positive developing solution that performs a developing treatment on the substrate coated with the positive resist solution or a negative developing solution that performs a developing treatment on the substrate coated with the negative resist solution is used.

Generally, an alkaline solution is used as the positive developing solution, and polar solvents such as a ketone-based solvent, an ester-based solvent, an alcohol-based solvent, an amide-based solvent, an ether-based solvent and the like and a hydrocarbon-based solvent are used as the negative developing solution. Therefore, if a waste solution of the positive developing solution and a waste solution of the negative developing solution are mixed together, the waste solutions may cause chemical reaction to make it impossible to appropriately perform waste solution treatment.

As one example of a developing treatment apparatus that prevents mixture of the waste solution of the positive developing solution and the waste solution of the negative developing solution, a developing treatment apparatus is known which is disclosed in Japanese Laid-open Patent Publication No. 2012-54469. According to this developing treatment apparatus, a developing treatment with the positive developing solution and a developing treatment with the negative developing solution are performed in separate modules to prevent mixture of the waste solution of the positive developing solution and the waste solution of the negative developing solution.

In the developing treatment apparatus disclosed in the above document, however, since the developing treatment with the positive developing solution and the developing treatment with the negative developing solution are performed in the separate modules, the number of modules equipped with the developing treatment apparatus increases.

SUMMARY OF THE INVENTION

The present invention has been made in consideration of the above circumstances, and has an object to enable reduction in size of a developing treatment apparatus capable of performing both a developing treatment with a positive developing solution and a developing treatment with a negative developing solution by reducing the number of modules installed therein.

To achieve the above object, the present invention is a developing treatment apparatus for performing development by supplying a developing solution to a substrate having a front surface coated with a positive resist or a negative resist and then subjected to exposure, the developing treatment apparatus including:

a substrate holding part that horizontally holds the substrate;

a rotary drive mechanism that rotates the substrate holding part around a vertical axis;

a positive developing solution supply nozzle that supplies a developing solution for the positive resist to the front surface of the substrate held by the substrate holding part;

a negative developing solution supply nozzle that supplies a developing solution for the negative resist to the front surface of the substrate held by the substrate holding part;

a cup body that is formed in a bottomed circular shape with an upper side open and collects the developing solution scattering with rotation of the substrate;

a first developing solution drain pipeline that is connected to an outer peripheral side of the cup body and drains one of the developing solutions for the positive resist and the negative resist collected by the cup body;

a second developing solution drain pipeline that is connected to an inner peripheral side of the cup body and drains another of the developing solutions for the positive resist and the negative resist collected by the cup body;

a fixed cup that has a peripheral wall between an inner peripheral wall of the cup body and an outer peripheral wall of the cup body and is formed on a lower side of the substrate held by the substrate holding part;

a movable cup that has a partition between the peripheral wall of the fixed cup and the outer peripheral wall of the cup body, and introduces one of the scattering developing solutions for the positive resist and the negative resist into an inner peripheral flow path surrounded by the partition and the peripheral wall of the fixed cup by raising the partition and introduces another of the scattering developing solutions for the positive resist and the negative resist into an outer peripheral flow path surrounded by the partition and the outer peripheral wall of the cup body by lowering the partition; and a control unit that raises the movable cup when using the developing solution for the positive resist and lowers the movable cup when using the developing solution for the negative resist.

According to another aspect, the present invention is a developing treatment apparatus for performing development by supplying a developing solution to a substrate having a front surface coated with a positive resist or a negative resist and then subjected to exposure, the developing treatment apparatus including:

a substrate holding part that horizontally holds the substrate;

a rotary drive mechanism that rotates the substrate holding part around a vertical axis;

a positive developing solution supply nozzle that supplies a developing solution for the positive resist to the front surface of the substrate held by the substrate holding part;

a negative developing solution supply nozzle that supplies a developing solution for the negative resist to the front surface of the substrate held by the substrate holding part;

a cup body that is formed in a bottomed circular shape with an upper side open and collects the developing solution scattering with rotation of the substrate;

a first developing solution drain pipeline that is connected to an outer peripheral side of the cup body and drains one of the developing solutions for the positive resist and the negative resist collected by the cup body;

a second developing solution drain pipeline that is connected to an inner peripheral side of the cup body and drains another of the developing solutions for the positive resist and the negative resist collected by the cup body;

a fixed cup that has a peripheral wall between an inner peripheral wall of the cup body and an outer peripheral wall of the cup body and is formed on a lower side of the substrate held by the substrate holding part; and a first drain device that is provided on the first developing solution drain pipeline and a second drain device that is provided on the second developing solution drain pipeline, wherein the first drain device and the second drain device are configured to drain the one developing solution or the another developing solution by driving one of the first drain device and the second drain device.

According to the present invention, it is possible to perform drain treatment of the developing solution without mixing the positive developing solution and the negative developing solution in a developing treatment apparatus installed in one module. Therefore, it is possible to reduce the number of modules installed in the developing treatment apparatus, thereby reducing the size of the developing treatment apparatus.

DETAILED DESCRIPTION OF THE INVENTION

Hereinafter, embodiments of this invention will be described based on the accompanying drawings. Here, a case where a developing treatment apparatus according to this invention is applied to a processing system that performs coating, developing and exposure treatment will be described.

Figure 1:
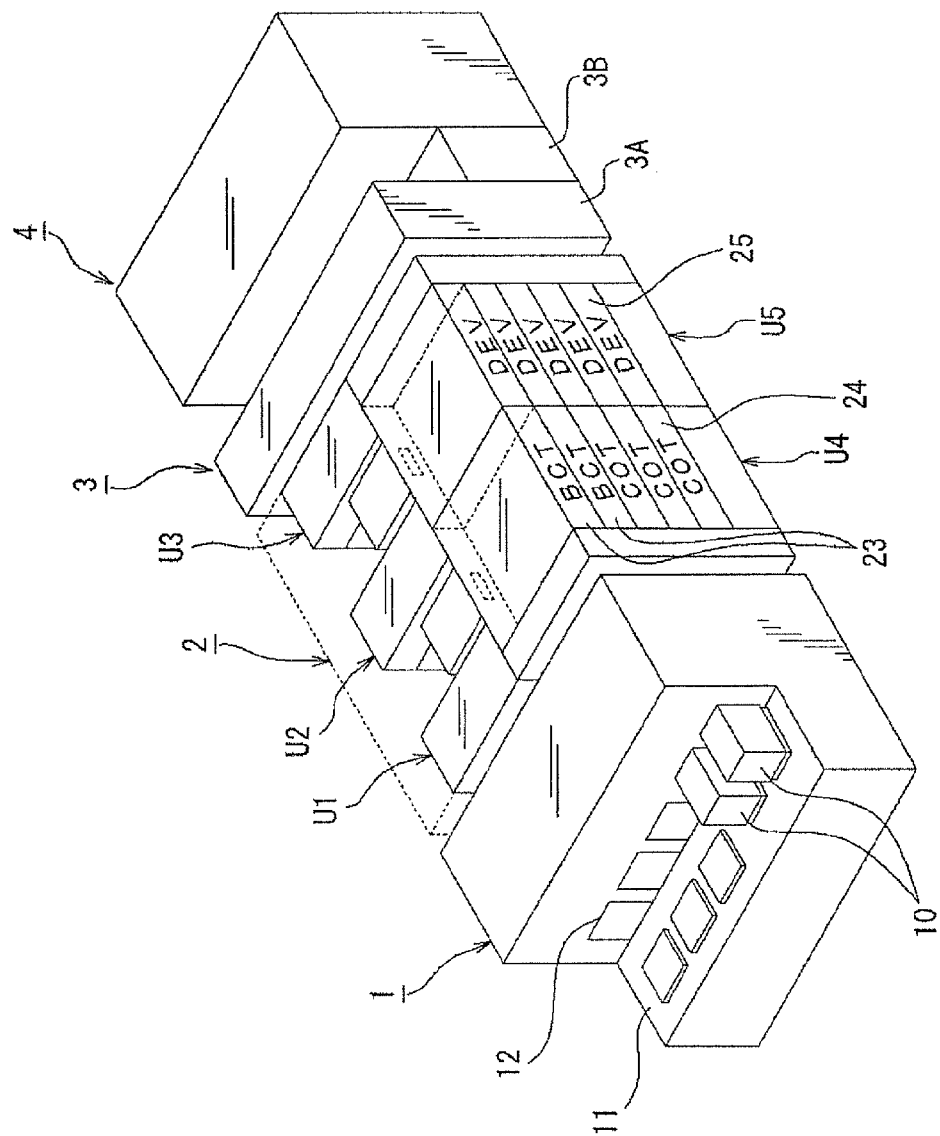
FIG. 1 is a schematic perspective view illustrating the whole processing system in which an exposure treatment apparatus is connected to a coating and developing treatment apparatus to which a developing treatment apparatus according to an embodiment is applied.
Figure 2:
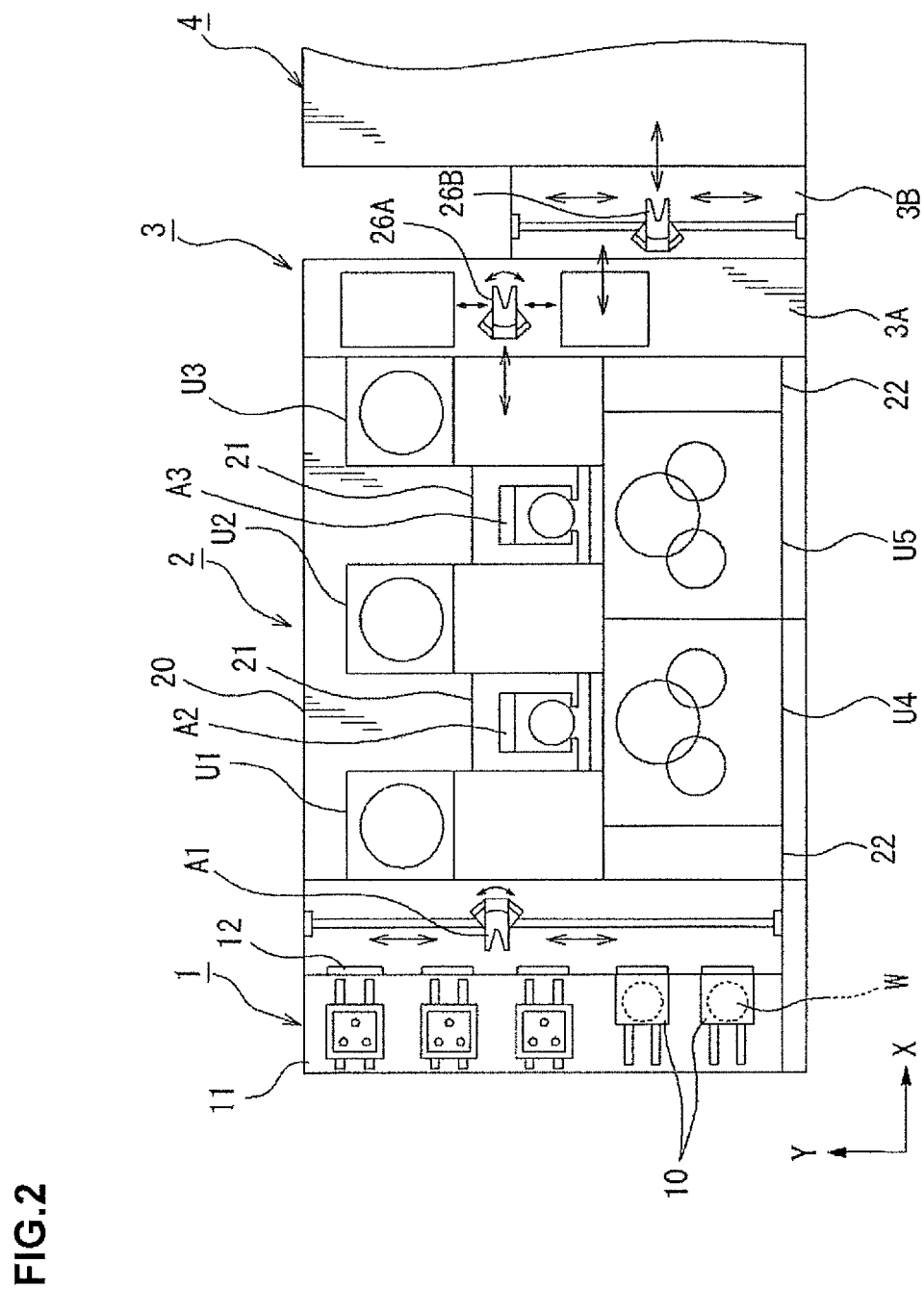
FIG. 2 is a schematic plan view of the processing system in FIG. 1.

This processing system includes, as illustrated in FIG. 1 and FIG. 2, a carrier station 1 to transfer in/out a carrier 10 that seals and houses a plurality of, for example, 25 semiconductor wafers W (hereinafter, referred to as wafers W) being substrates, a treatment section 2 that performs resist coating, developing treatments and so on on the wafer W taken out of the carrier station 1, an exposure section 4 that performs liquid-immersion exposure on the front surface of the wafer W with a liquid layer transmitting light formed on the front surface of the wafer W, and an interface section 3 that is connected between the treatment section 2 and the exposure section 4 and delivers the wafer W.

In the carrier station 1, a mounting part 11 capable of mounting a plurality of carriers 10 side by side thereon, an opening/closing part 12 provided in a front wall surface as seen from the mounting part 11, and a delivery device A1 to take the wafer W out of the carrier 10 via the opening/closing part 12 are provided.

The interface section 3 is composed of a first transfer chamber 3A and a second transfer chamber 3B which are provided one behind the other between the treatment section 2 and the exposure section 4 and provided with a first wafer transfer unit 26A and a second wafer transfer unit 26B respectively.

To the rear side of the carrier station 1, the treatment section 2 is connected which is surrounded at the periphery by a housing 20. In the treatment section 2, shelf units U1, U2, U3 in each of which units of heating and cooling systems are multi-tiered and main transfer devices A2, A3 that transfer the wafer W between the units in the shelf units U1, U2, U3 and units in solution treatment units U4, U5 are provided arranged alternately in sequence from the front side. Further, each of the main devices A2, A3 is placed in a space surrounded by a partition wall 21 composed of face portions on the side of the shelf units U1, U2, U3 which are arranged in a forward and backward direction as viewed from the carrier station 1, one face portion on the side of, for example, the later-described solution treatment unit U4, U5 on the right side, and a rear face portion forming one face on the left side. Further, temperature and humidity regulating units 22 each including a temperature regulator for treatment solutions used in the units, a duct for regulating the temperature and humidity and so on are disposed respectively between the carrier station 1 and the treatment section 2 and between the treatment section 2 and the interface section 3.

The shelf units U1, U2, U3 are configured such that various kinds of units to perform pre-processing and post-processing of the treatments performed in the solution treatment units U4, U5 are multi-tiered, for example, ten-tiered, in which the combination of the units includes a heating unit (not illustrated) that heats (bakes) the wafer W, a cooling unit (not illustrated) that cools the wafer W, and so on. Further, the solution treatment units U4, U5 are configured such that anti-reflection film coating units (BCT) 23 that apply an anti-reflection film, coating units (COT) 24, developing units (DEV) 25 that apply a developing solution to the wafer W to perform developing treatment and so on are multi-tiered, for example, five-tiered on chemical storage units for the resist solution, the developing solution and so on, for example, as illustrated in FIG. 1. A developing treatment apparatus 50 according to this invention is provided in the developing unit (DEV) 25. Further, the anti-reflection film coating units (BCT) 23, the coating units (COT) 24, and the developing units (DEV) 25 correspond to modules in this invention.

On the basis of an example, the flow of the wafer in the coating and developing treatment apparatus configured as described above will be briefly described referring to FIG. 1 and FIG. 2. First, when the carrier 10 housing, for example, 25 wafers W is mounted on the mounting part 11, the lid body of the carrier 10 is removed together with the opening/closing part 12, and a wafer W is taken out by the delivery device A1. The wafer W is delivered via a delivery unit (not illustrated) forming one tier in the shelf unit U1 to the main transfer device A2, subjected, for example, to anti-reflection film forming treatment and cooling processing as the pre-processing of the coating treatment, and then coated with a resist solution in the coating unit (COT) 24. Subsequently, by the main transfer device A2, the wafer W is heated (baking processing) in the heating unit forming one tier in one of the shelf units U1 to U3, cooled, and then carried via the delivery unit in the shelf unit U3 into the interface section 3. In the interface section 3, the wafer W is transferred by the first wafer transfer unit 26A and the second wafer transfer unit 26B in the first transfer chamber 3A and the second transfer chamber 3B to the exposure section 4, and subjected to exposure by an exposure device (not illustrated) disposed to face the front surface of the wafer W. After the exposure, the wafer W is transferred in a reverse route to the main transfer device A2 and developed in the developing unit (DEV) 25, whereby a pattern is formed on the wafer W. Thereafter, the wafer W is returned to the original carrier 10 mounted on the mounting part 11.

First Embodiment

Figure 3:
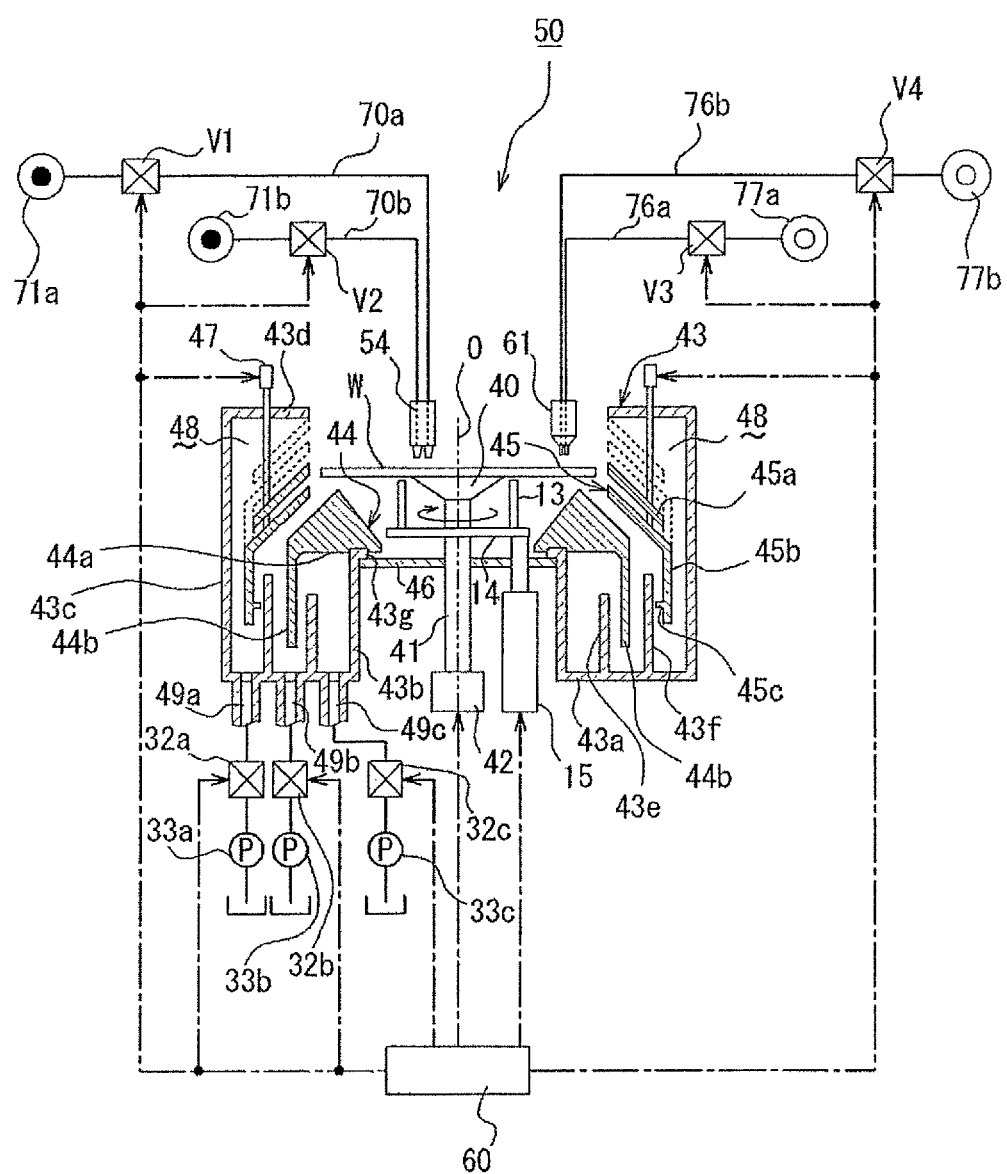
FIG. 3 is a schematic cross-sectional view illustrating a developing treatment apparatus according to a first embodiment of the present invention.
Figure 4:
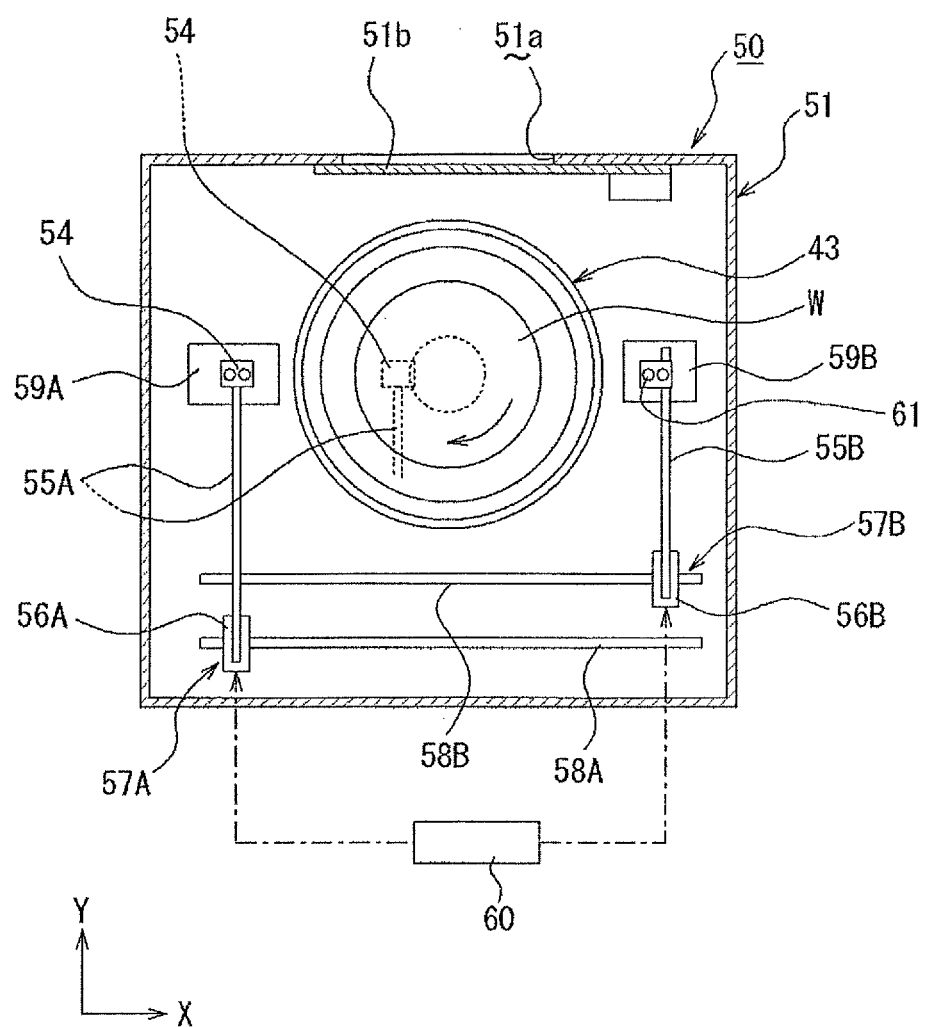
FIG. 4 is a schematic plan view of the developing treatment apparatus according to the first embodiment.

Next, the developing treatment apparatus 50 of the first embodiment according to this invention will be described. As illustrated in FIG. 3 and FIG. 4, the developing treatment apparatus 50 includes a spin chuck 40 forming a substrate holding part that horizontally holds the wafer W by absorbing and suction-holding the central portion on the rear surface side thereof, in a casing 51 having a transfer-in/out port 51a for the wafer W. Note that at the transfer-in/out port 51a, a shutter 51b is provided to be able to open and close.

The spin chuck 40 is connected via a shaft part 41 to a rotary drive mechanism 42 such as a servo motor or the like, and is configured to be rotatable, by the rotary drive mechanism 42, around a vertical axis O while holding the wafer W. Note that the rotary drive mechanism 42 is electrically connected to a controller 60 corresponding to a control unit of this invention so that the number of rotations of the spin chuck 40 is controlled based on a control signal from the controller 60. In this case, by the controller 60, the number of rotations of the spin chuck 40 when using the developing solution for a later-described positive resist is controlled, for example, to 3,000 rpm and the number of rotations of the spin chuck 40 when using the developing solution for a later-described negative resist is controlled, for example, to 2,000 rpm, so that the number of rotations of the spin chuck 40 when using the developing solution for the positive resist is set to be larger (faster) than the number of rotations of the spin chuck 40 when using the developing solution for the negative resist.

The controller 60 is electrically connected to the main transfer devices A2, A3 and a later-described raising and lowering mechanism 15 so that the main transfer devices A2, A3 and the raising and lowering mechanism 15 are controlled based on control signals from the controller 60.

In this case, as illustrated in FIG. 3, three (two of them are illustrated in the drawing) support pins 13 being a substrate support member that supports the wafer W to be able to raise and lower the wafer W with respect to the spin chuck 40 are erected on an annular holding plate 14 surrounding the shaft part 41 below a wafer holding part of the spin chuck 40. The holding plate 14 is formed to be able to rise and lower in the vertical direction by means of the raising and lowering mechanism 15 such as a cylinder or the like. The raising and lowering mechanism 15 is controlled to raise and lower the holding plate 14 based on a control signal from the controller 60 so that the support pins 13 rise and lower with respect to the wafer holding part of the spin chuck 40 with the rising and lowering of the holding plate 14.

More specifically, the controller 60 drives the raising and lowering mechanism 15 to raise the support pins 13, thereby moving the wafer W after the developing treatment held by the spin chuck 40 to a delivery position above the spin chuck 40. The controller 60 performs control such that the wafer W in this state is delivered to the main transfer device A2, the main transfer device A2 transfers the wafer W out of the apparatus, and the support pins 13 then receives an undeveloped wafer W transferred by the main transfer device A2 and are then lowered to mount the wafer W on a holding surface of the spin chuck 40.

A cup body 43 formed in a bottomed circular shape with an upper side open is provided in a manner to surround a side part of the wafer W held by the spin chuck 40. The cup body 43 has a bottom plate 43*a*, an inner peripheral wall 43*b* erected upward starting from an inner peripheral end of the bottom plate 43*a*, an outer peripheral wall 43*c* erected upward starting from an outer peripheral end of the bottom plate 43*a*, and an upper wall 43*d* extending inward from the upper end of the outer peripheral wall 43*c*, and is opened on the upper side of the inner peripheral wall 43*b*. The cup body 43 has, in order from the inner peripheral side, a first side wall 43*e* and a second side wall 43*f* which are provided between the inner peripheral wall 43*b* and the outer peripheral wall 43*c* and erected upward from the bottom plate 43*a*. At the upper end of the inner peripheral wall 43*b*, a projection 43*g* is provided toward the inner peripheral side to fix the position of the cup body 43 by holding the projection 43*g* between a fixed cup 44 and a holding plate 46.

On the lower side of the wafer W held by the spin chuck 40, the fixed cup 44 in a cylindrical shape is provided. At an upper portion of the fixed cup 44, an apex portion whose cross section along the vertical axis O of the spin chuck 40 is formed in a mount shape is provided. At an outer peripheral end of a bottom plate 44*a* of the fixed cup 44, a peripheral wall 44*b* extending downward is provided. The peripheral wall 44*b* is disposed between the inner peripheral wall 43*b* and the outer peripheral wall 43*c* of the cup body 43.

Figure 3A:
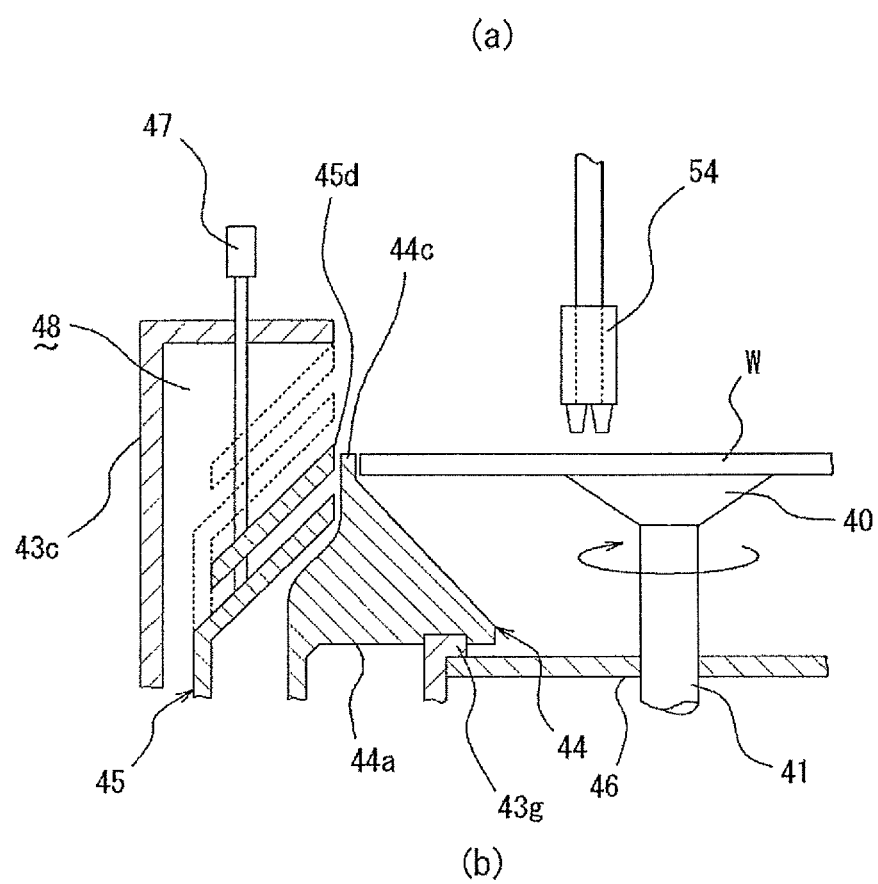
FIG. 3A(a) is a cross-sectional view illustrating another form of a fixed cup in the present invention, and FIG. 3A(b) is an enlarged cross-sectional view of a principal part of the fixed cup.
Figure 3A:
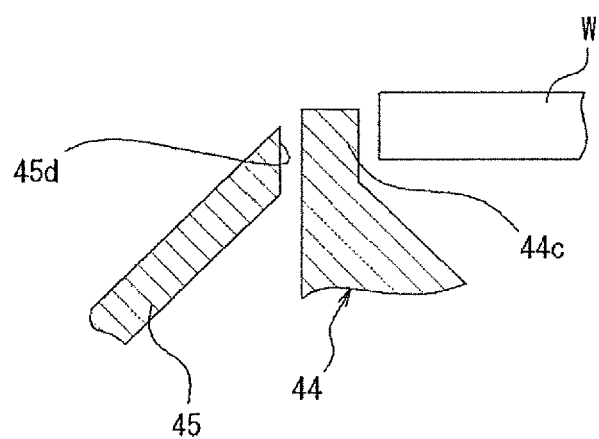

In this case, as illustrated in FIG. 3A, the fixed cup 44 is desirably configured to have an annular projection 44*c* for gas/liquid separation located between a periphery of the wafer W held by the spin chuck 40 and an opening rim 45*d* of a later-described movable cup 45. Note that the upper end of the annular projection 44*c* is desirably located to be flush with or below the upper surface of the wafer W and located to be flush with or above the upper end of the opening rim 45*d* of the movable cup 45.

The annular projection 44*c* for gas/liquid separation located between the periphery of the wafer W held by the spin chuck 40 and the opening rim 45*d* of the movable cup 45 is provided at the fixed cup 44 as described above, thereby making it possible to prevent the developing solution flowing down below the wafer W from intruding into a second developing solution drain pipeline 49*b* when performing developing treatment with the movable cup 45 lowered.

Figure 3B:
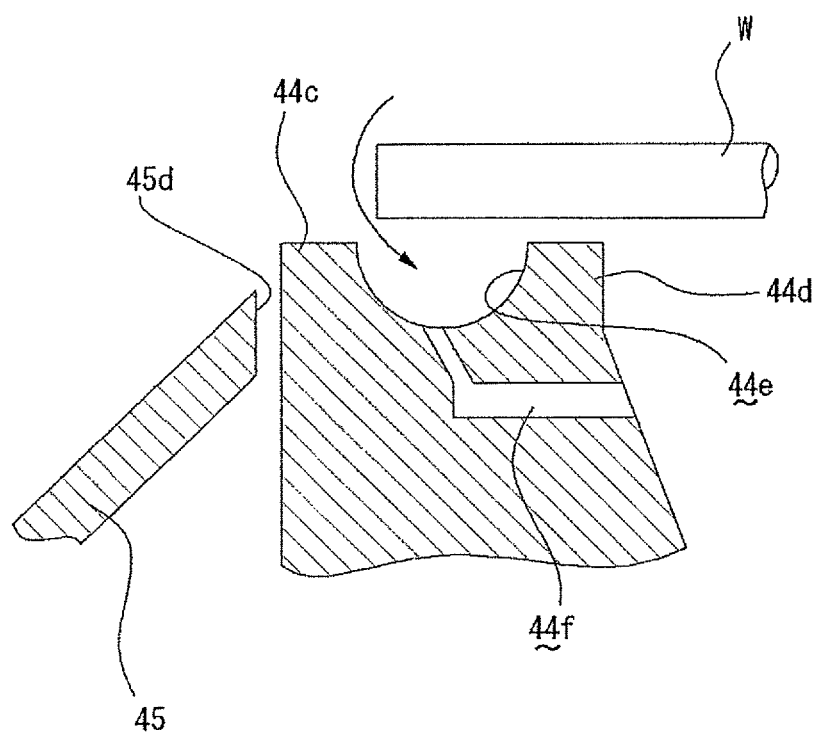
FIG. 3B is an enlarged cross-sectional view of a still another form of the fixed cup.

The fixed cup 44 may have, in place of the above structure, a structure in which an annular knife edge 44*d* close to a lower surface of the wafer W is provided on the inner peripheral side of the annular projection 44*c* and a drainage passage 44*f* communicating with the bottom of the cup body 43 is formed at the bottom of an annular recessed groove 44*e* formed between the annular projection 44*c* and the annular knife edge 44*d*, as illustrated in FIG. 3B.

This configuration makes it possible to trap the developing solution flowing around to the rear surface side of the wafer W during the developing treatment in the annular recessed groove 44*e* and prevent it from flowing down below the wafer W. Further, the developing solution trapped in the annular recessed groove 44*e* is drained to the bottom of the cup body 43 via the drainage passage 44*f*.

The movable cup 45 is disposed in a space part 48 surrounded by the bottom plate 43*a*, the outer peripheral wall 43*c*, the upper wall 43*d*, and the fixed cup 44. The movable cup 45 includes a tapered part 45*a* composed of tapered plates decreasing in diameter on the upper side superposed at two tiers, a cylindrical partition 45*b* provided on the lower side of the tapered part 45*a*, and a projection 45*c* attached to the inner peripheral surface of the partition 45*b*. The partition 45*b* is provided between the peripheral wall 44*b* of the fixed cup 44 and the outer peripheral wall 43*c* of the cup body 43. Further, the projection 45*c* is attached to the inner peripheral surface of the partition 45*b* such that the second side wall 43*f* and the projection 45*c* become closer to each other when the movable cup 45 is lowered and the projection 45*c* is located above the second side wall 43*f* when the movable cup 45 is raised.

Above the movable cup 45, a raising and lowering part 47 to raise or lower the movable cup 45 is provided. When the movable cup 45 is raised by the raising and lowering part 47, the movable cup 45 is moved so that the tip portion of the tapered part 45*a* is located above the wafer W held by the spin chuck 45. When the movable cup 45 is lowered by the raising and lowering part 47, the movable cup 45 is moved so that the tip portion of the tapered part 45*a* is located below the wafer W held by the spin chuck 45. To the raising and lowering part 47, the controller 60 corresponding to its control unit is connected, so that the movable cup 45 is raised and lowered based on the control signal from the controller 60.

Figure 6:
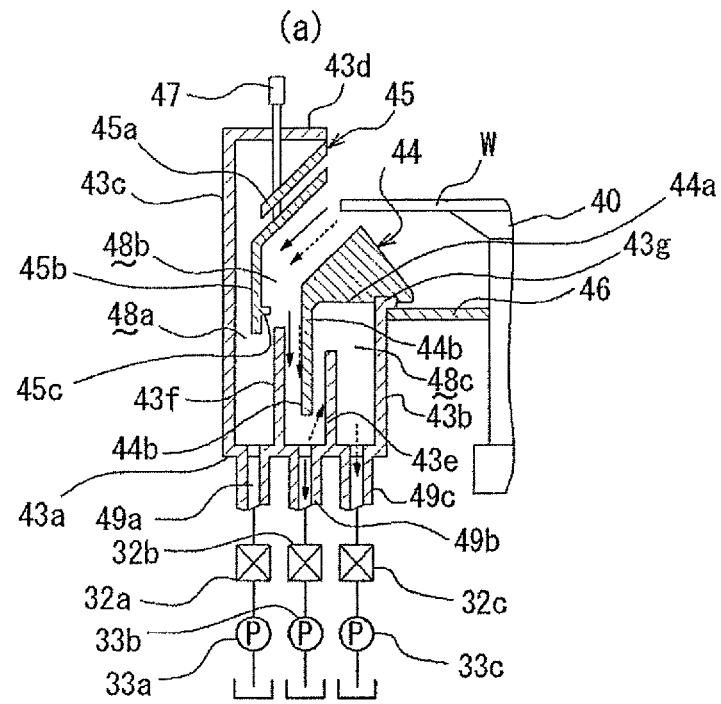
FIG. 6(a) is a schematic cross-sectional view illustrating flow paths for the developing solution and mist when a developing treatment with a positive developing solution is performed in the developing treatment apparatus according to the first embodiment.
FIG. 6(b) is a schematic cross-sectional view illustrating flow paths for the developing solution and mist when a developing treatment with a negative developing solution is performed.
Figure 6:
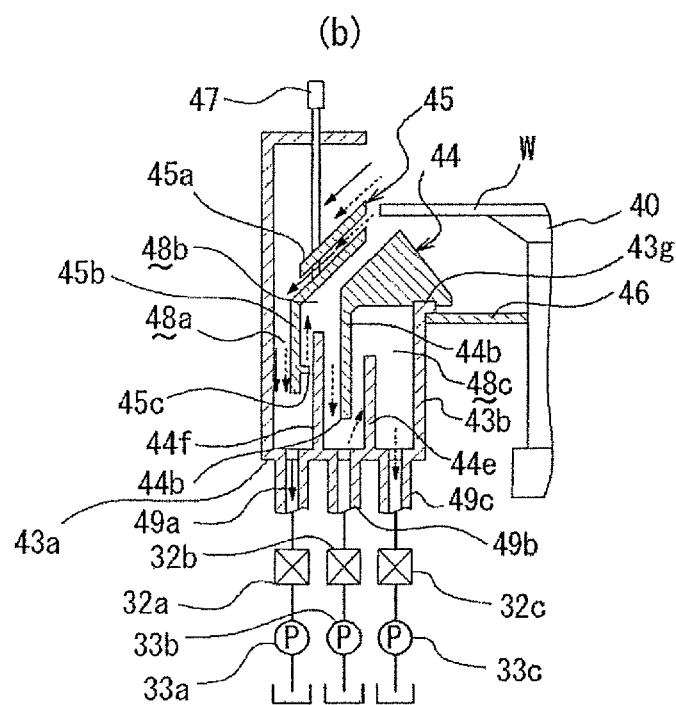

As illustrated in FIG. 6, the space part 48 is composed of an outer peripheral flow path 48*a* surrounded by the upper wall 43*d*, the outer peripheral wall 43*c*, and the movable cup 45, and an inner peripheral flow path 48*b* surrounded by the movable cup 45, the second side wall 43*f*, the bottom plate 43*a*, and the fixed cup 44. Further, on the lower side of the fixed cup 44, an exhaust flow path 48*c* is formed which is surrounded by the fixed cup 44, the bottom plate 43*a*, and the inner peripheral wall 43*b* and communicates with the inner peripheral flow path 48*b*.

At the bottom plate 43*a* of the cup body 43, a first developing solution drain pipeline 49*a* and the second developing solution drain pipeline 49*b* that drain a scattering developing solution. The first developing solution drain pipeline 49*a* is connected to the outer peripheral side of the cup body 43 and communicates with the outer peripheral flow path 48a. Further, on the secondary side of the first developing solution drain pipeline 49a, a developing solution opening/closing valve 32a and a developing solution pump 33a are provided. On the other hand, the second developing solution drain pipeline 49b is connected to the inner peripheral side of the cup body 43 and communicates with the inner peripheral flow path 48b. Further, on the secondary side of the second developing solution drain pipeline 49b, a developing solution opening/closing valve 32b and a developing solution pump 33b are provided. The developing solution opening/closing valves 32a, 32b perform opening/closing operations based on signals from the controller 60.

Here, the developing solution opening/closing valve 32a and the developing solution pump 33a correspond to a first drain device in this invention, and the developing solution opening/closing valve 32b and the developing solution pump 33b correspond to a second drain device in this invention.

At the bottom plate 43a of the cup body 43 and on the inner peripheral side of the first side wall 43e, an exhaust pipeline 49c to exhaust gas (mist) generated due to the scattering of the developing solution is provided. The exhaust pipeline 49c communicates with the exhaust flow path 48c and is provided with a mist opening/closing valve 32c and a mist pump 33c on the secondary side (see FIG. 6). The mist opening/closing valve 32c performs an opening/closing operation based on a signal from the controller 60.

Figure 5A:
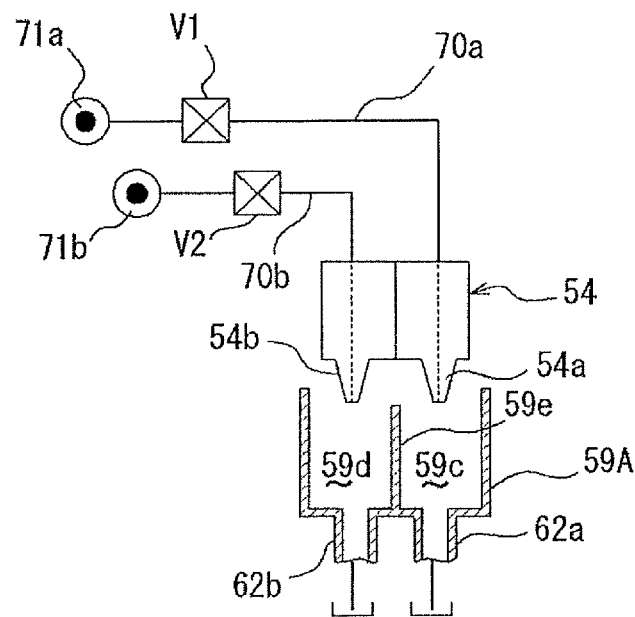
FIG. 5A is a schematic cross-sectional view of a developing solution supply nozzle and a waiting part for the developing solution supply nozzle of the developing treatment apparatus according to the first embodiment.

On the other hand, on the upper side of the wafer W held by the spin chuck 40, a developing solution supply nozzle 54 (hereinafter, referred to as a developing nozzle 54) capable of rising and lowering and horizontally moving is provided in a manner to face the central portion of the front surface of the wafer W via a gap. In this case, as illustrated in FIG. 5A, the developing nozzle 54 has, on the lower side, a positive developing solution supply nozzle 54a that supplies (discharges) a developing solution for a positive resist (hereinafter, denoted by a positive developing solution) and a negative developing solution supply nozzle 54b that supplies (discharges) a developing solution for a negative resist (hereinafter, denoted by a negative developing solution).

Here, as the positive developing solution, for example, tetramethylammonium hydroxide (TMAH) is used. As the negative developing solution, a developing solution containing an organic solvent is used, namely, polar solvents such as a ketone-based solvent, an ester-based solvent, an alcohol-based solvent, an amide-based solvent, an ether-based solvent and the like and a hydrocarbon-based solvent and the like can be used. In this embodiment, a developing solution containing butyl acetate being an ester-based solvent is used.

The developing nozzle 54 is supported on one end side of a nozzle arm 55A, and the other end side of the nozzle arm 55 is coupled to a moving base 56A including a not-illustrated raising and lowering mechanism, and the moving base 56A is configured to be movable in the lateral direction along a guide member 58A extending in an X-direction, by a developing solution supply nozzle moving mechanism 57A (hereinafter, referred to as a developing nozzle moving mechanism 57A) such as a ball screw, a timing belt or the like. By moving the developing nozzle moving mechanism 57A, the developing nozzle 54 moves along a straight line (radius) starting from the central portion to the peripheral portion of the wafer W.

On the outside on one side of the cup body 43, a waiting part 59A for the developing nozzle 54 is provided, and the nozzle tip portion of the developing nozzle 54 is cleaned at the waiting part 59A.

Figure 5B:
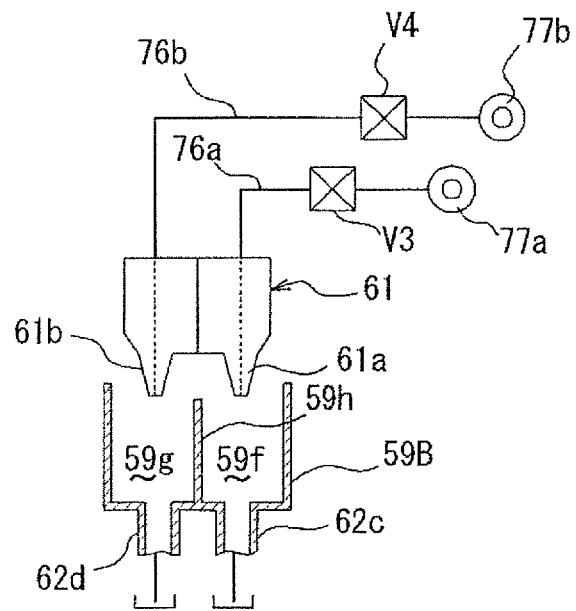
FIG. 5B is a schematic cross-sectional view of a cleaning solution supply nozzle and a waiting part for the cleaning solution supply nozzle of the developing treatment apparatus according to the first embodiment.

On the upper side of the wafer W held by the spin chuck 40, a rinse solution supply nozzle 61 (hereinafter, referred to as a rinse nozzle 61) that supplies (discharges) a cleaning solution (rinse solution) is provided to be capable of rising and lowering and horizontally moving in a manner to face the central portion of the front surface of the wafer W via a gap. The rinse nozzle 61 has, as illustrated in FIG. 5B, a positive cleaning solution supply nozzle (positive rinse solution supply nozzle) 61a that supplies a rinse solution for the positive resist (hereinafter, referred to as a positive rinse solution) to the wafer W and a negative cleaning solution supply nozzle (negative rinse solution supply nozzle) 61b that supplies a rinse solution for the negative resist (hereinafter, referred to as a negative rinse solution) to the wafer W.

Here, as the positive rinse solution, DIW (deionized water) is used. Further, as the negative rinse solution, an organic solvent, for example, a rinse solution containing alcohol having an alkyl chain including at least one of a branch structure and a ring structure in which the number of carbons of the secondary or tertiary carbon atom in the alkyl chain bonded to a hydroxyl group is at least 5, or dialkylether having at least one of an alkyl group in which the number of carbons is at least 5 and a cycloalkyl group in which the number of carbons is at least 5 can be used. In this embodiment, a rinse solution containing 4-methyl-2-pentanol (MIBC) is used.

The rinse nozzles 61a, 61b are held on one end side of the nozzle arm 55B to be parallel with each other, and the other end side of the nozzle arm 55B is coupled to a moving base 56B including a not-illustrated raising and lowering mechanism, and the moving base 56B is configured to be movable in the lateral direction along a guide member 58B extending in the X-direction by a rinse solution supply nozzle moving mechanism 57B (hereinafter, referred to as a rinse nozzle moving mechanism 57B) such as a ball screw, a timing belt or the like, namely, to be movable in the radial direction starting from the central portion to the peripheral portion of the wafer W. Note that on the outside on one side of the cup body 43, a waiting part 59B for the rinse nozzle 61 is provided.

The positive developing solution supply nozzle 54a is connected to a developing solution supply source 71a via a developing solution supply pipe 70a provided with an opening/closing valve V1. Further, the negative developing solution supply nozzle 54b is connected to a developing solution supply source 71b via a developing solution supply pipe 70b provided with an opening/closing valve V2.

On the other hand, the positive rinse solution supply nozzle 61a is connected to a rinse solution supply source 77a via a rinse solution supply pipe 76a provided with an opening/closing valve V3. Further, the negative rinse solution supply nozzle 61b is connected to a rinse solution supply source 77b via a rinse solution supply pipe 76b provided with an opening/closing valve V4.

The moving bases 56A, 56B, the developing nozzle moving mechanism 57A, the rinse nozzle moving mechanism 57B, and the opening/closing valves V1 to V4 are individually electrically connected to the controller 60 and configured such that the horizontal movement and raising and lowering movement of the developing nozzle 54 and the rinse nozzle 61 and the opening/closing driving of the opening/closing valves V1 to V4 are performed based on control signals which have been previously stored in the controller 60. The controller 60 controls the opening/closing driving of the opening/closing valves V1, V2 and thereby enables control of supply of the developing solution from the developing nozzle 54 to the wafer W, and controls the opening/closing driving of the opening/closing valves V3, V4 and thereby enables control of supply of the rinse solution from the rinse nozzle 61 to the wafer W.

Next, the waiting parts 59A, 59B will be described based on FIG. 4 and FIG. 5A, FIG. 5B.

The waiting part 59A is provided on the outer peripheral side of the cup body 43 and is formed to allow the developing nozzle 54 to be inserted therein from above. The waiting part 59A has a storage part 59c that stores a residue of the positive developing solution discharged from the positive developing solution supply nozzle 54a and a storage part 59d that stores a residue of the negative developing solution discharged from the negative developing solution supply nozzle 54b, and the storage parts 59c, 59d are separated from each other by a separation wall 59e. A drain pipeline 62a that drains the positive developing solution communicates with the storage part 59c, and a drain pipeline 62b that drains the negative developing solution communicates with the storage part 59d. The developing nozzle 54 is inserted into the waiting part 59A by the moving base 56A moving in the vertical direction and the developing nozzle moving mechanism 57A, and cleaning and so on of the nozzle tip portion of the developing nozzle 54 are performed at the waiting part 59A.

The waiting part 59B is provided on the outer peripheral side of the cup body 43 and is formed to allow the rinse nozzle 61 to be inserted therein from above. The waiting part 59B has a storage part 59f that stores a residue of the positive rinse solution discharged from the positive rinse solution supply nozzle 61a and a storage part 59g that stores a residue of the negative rinse solution discharged from the negative rinse solution supply nozzle 61b, and the storage parts 59f, 59g are separated from each other by a separation wall 59h. A drain pipeline 62c that drains the positive rinse solution communicates with the storage part 59f, and a drain pipeline 62d that drains the negative rinse solution communicates with the storage part 59g. The rinse nozzle 61 is inserted into the waiting part 59B by the moving base 56B moving in the vertical direction and the rinse nozzle moving mechanism 57B, and cleaning and so on of the nozzle tip portion of the rinse nozzle 61 are performed at the waiting part 59B.

Next, based on the FIG. 6(a), FIG. 6(b), draining of the developing solution in the first embodiment will be described. FIG. 6(a) illustrates drain pathways for the developing solution and gas (mist) generated due to scattering of the developing solution in the case of a positive developing treatment of supplying the positive developing solution from above the wafer W. FIG. 6(b) illustrates pathways for the developing solution and mist in the case of a negative developing treatment of supplying the negative developing solution from above the wafer W. Solid lines in FIG. 6(a), FIG. 6(b) illustrate the flow paths of the developing solution and broken lines illustrate the flow paths of the mist.

When the movable cup 45 has been moved up (in the case of the positive developing treatment) as illustrated in FIG. 6(a), the positive developing solution and the mist are introduced into the inner peripheral flow path 48b. In this event, based on the signals from the controller 60, the developing solution opening/closing valve 32a is closed, the developing solution opening/closing valve 32b is opened, and the developing solution pump 33b is driven. Thus, the developing solution introduced into the inner peripheral flow path 48b is drained from the second developing solution drain pipeline 49b. Based on the signals from the controller 60, the mist opening/closing valve 32c is opened and the mist pump 33c is driven. Thus, the mist introduced into the exhaust flow path 48c is exhausted from the exhaust pipeline 49c.

In the positive developing treatment, based on the signal from the controller 60, the rotary drive mechanism 42 is driven to rotate the spin chuck 40 at a high speed, for example, at a number of rotations of 3,000 rpm. By rotating the spin chuck 40 at a high speed as described above, the internal pressure in the cup body 43 increases, but there is an area of the outer peripheral flow path 48a (negative treatment area), which is brought into a negative pressure, outside the cup body 43, so that there is no gas flow going out of the cup body 43.

When the movable cup 45 has been moved down (in the case of the negative developing treatment) as illustrated in FIG. 6(b), the negative developing solution and the mist are introduced into the outer peripheral flow path 48a. In this event, based on the signals from the controller 60, the developing solution opening/closing valve 32a is opened, the developing solution opening/closing valve 32b is closed, and the developing solution pump 33a is driven. Thus, the developing solution introduced into the outer peripheral flow path 48a is drained from the first developing solution drain pipeline 49a. Further, based on the signals from the controller 60, the mist opening/closing valve 32c is opened and the mist pump 33c is driven. Thus, the mist introduced into the exhaust flow path 48c is exhausted from the exhaust pipeline 49c.

In the negative developing treatment, based on the signal from the controller 60, the rotary drive mechanism 42 is driven to rotate the spin chuck 40 at a speed lower than that in the positive developing treatment, for example, at a number of rotations of 2,000 rpm. By rotating the spin chuck 40 at the speed lower than that in the positive developing treatment as described above, the internal pressure in the cup body 43 hardly increases, and there is no area brought into a positive pressure inside the cup body 43, so that there is no gas flow going out of the cup body 43.

According to the first embodiment, the movable cup 45 is raised, when using the positive developing solution, to introduce the developing solution and the mist into the inner peripheral flow path 48b and the movable cup 45 is lowered, when using the negative developing solution, to introduce the developing solution and the mist into the outer peripheral flow path 48a, thereby ensuring that the developing treatment apparatus 50 installed in one module performs drain treatment of the developing solution without mixing the positive developing solution and negative developing solution. Thus, the number of modules installed in the developing treatment apparatus can be reduced to provide an effect of reducing the size of the developing treatment apparatus.

Further, according to the first embodiment, the first and second developing solution drain pipelines 49a, 49b are provided with the respective developing solution pumps 33a, 33b and developing solution opening/closing valves 32a, 32b. When the developing solution pump 33a is driven and the developing solution opening/closing valve 32a is opened, driving of the developing solution pump 33b is stopped and the developing solution opening/closing valve 32b is closed, whereas when the developing solution pump 33b is driven and the developing solution opening/closing valve 32b is opened, driving of the developing solution pump 33a is stopped and the developing solution opening/closing valve 32a is closed, thereby providing an effect of increasing the efficiency of drain treatment of the developing solution without mixing the positive developing solution and the negative developing solution.

Second Embodiment

Next, a developing treatment apparatus 50 of the second embodiment according to this invention will be described based on FIG. 7, FIG. 8(a), FIG. 8(b). Note that the same contents as those of the developing treatment apparatus 50 illustrated in FIG. 3, FIG. 6(a), FIG. 6(b) are given the same numerals as those in FIG. 3, FIG. 6(a), FIG. 6(b), and the description thereof will be omitted.

Figure 7:
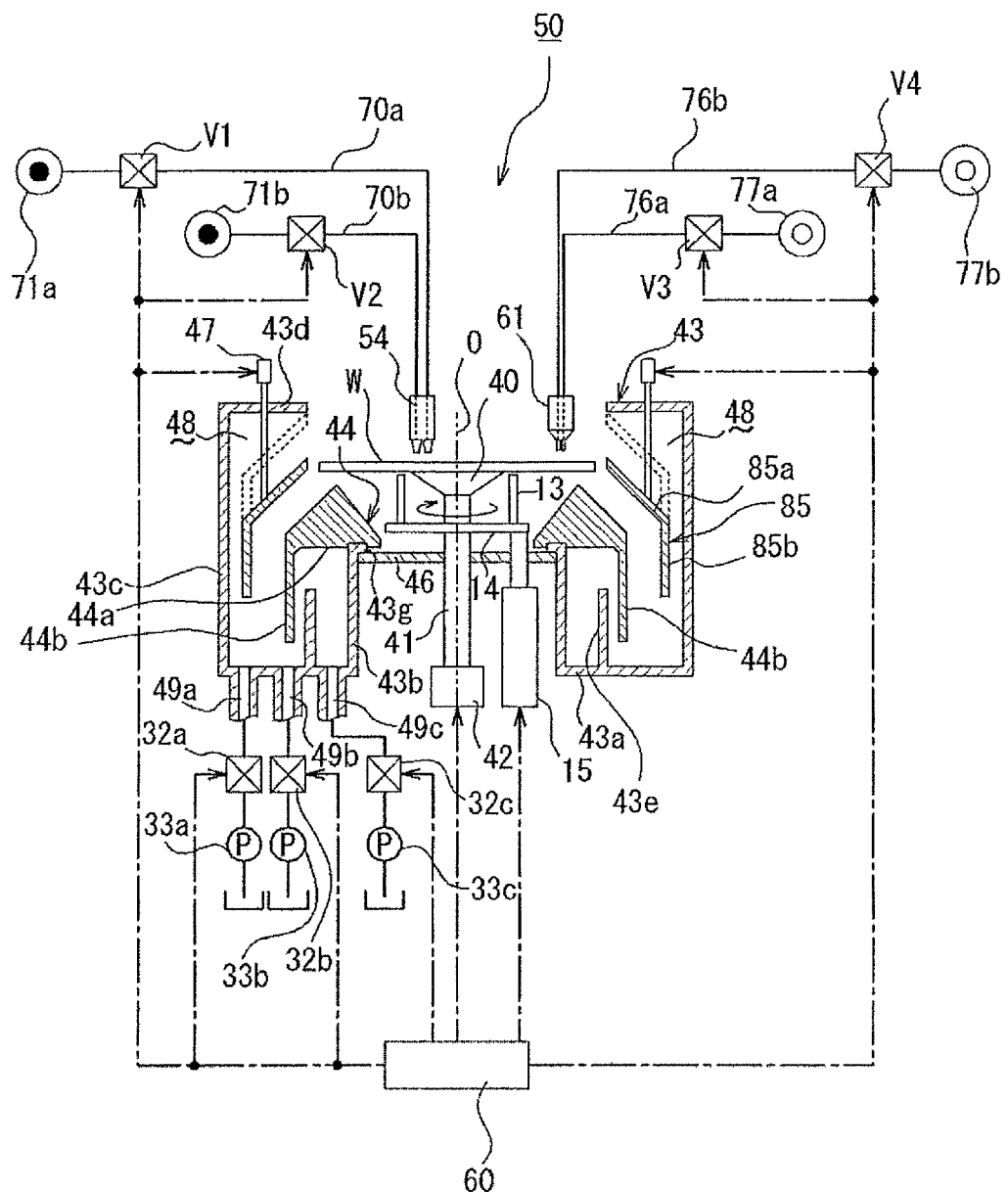
FIG. 7 is a schematic cross-sectional view illustrating a developing treatment apparatus according to a second embodiment.

As illustrated in FIG. 7, a movable cup 85 of the second embodiment is different from the movable cup 45 of the first embodiment in that a tapered part 85a forms one tier and that the projection 45c is not provided at the inner peripheral surface of a partition 85b. Further, a cup body 43 of the second embodiment is different from the cup body 43 of the first embodiment in that the second side wall 43f is not provided.

Draining of the developing solution in the second embodiment will be described based on FIG. 8(a), FIG. 8(b).

Figure 8:
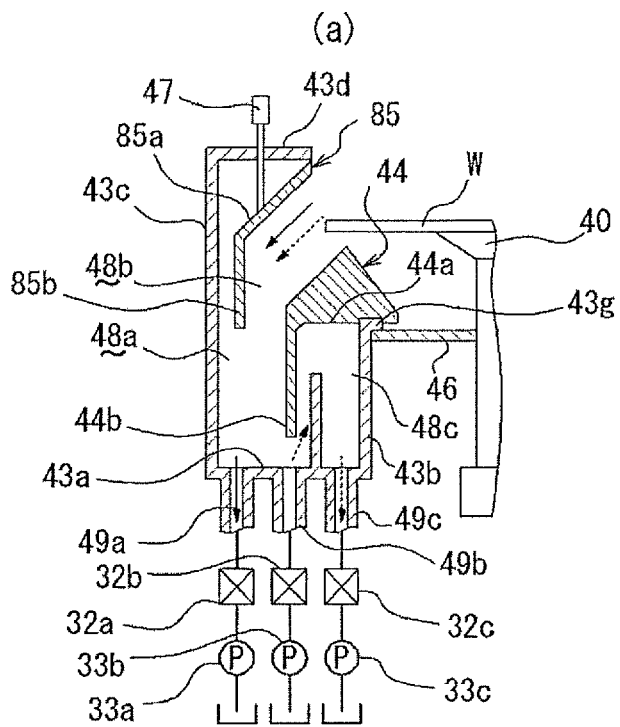
FIG. 8(a) is a schematic cross-sectional view illustrating flow paths for the developing solution and mist when the developing treatment with the positive developing solution is performed in the developing treatment apparatus according to the second embodiment.
FIG. 8(b) is a schematic cross-sectional view illustrating flow paths for the developing solution and mist when the developing treatment with the negative developing solution is performed.
Figure 8:
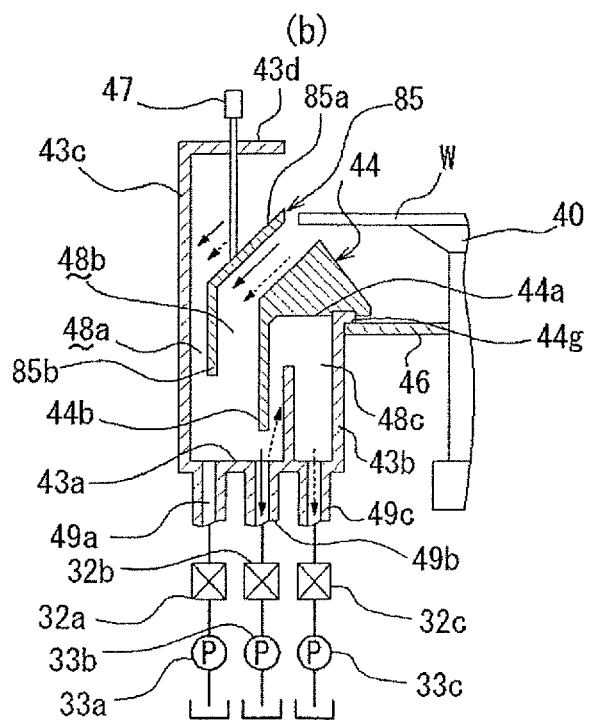

When the movable cup 85 has been moved up (in the case of the positive developing treatment) as illustrated in FIG. 8(a), the positive developing solution and the mist are introduced into the inner peripheral flow path 48b. In this event, based on the signals from the controller 60, the developing solution opening/closing valve 32b is closed, the developing solution opening/closing valve 32a is opened, and the developing solution pump 33a is driven. Thus, the developing solution introduced into the inner peripheral flow path 48b is drained from the first developing solution drain pipeline 49a.

When the movable cup 45 has been moved down (in the case of the negative developing treatment) as illustrated in FIG. 8(b), the negative developing solution and the mist are introduced into the outer peripheral flow path 48a and the inner peripheral flow path 48b. In this event, based on the signals from the controller 60, the developing solution opening/closing valve 32a is closed, the developing solution opening/closing valve 32b is opened, and the developing solution pump 33b is driven. Thus, the developing solution introduced into the outer peripheral flow path 48a is drained from the second developing solution drain pipeline 49b. Further, based on the signals from the controller 60, the mist opening/closing valve 32c is opened and the mist pump 33c is driven. Thus, the mist introduced into the exhaust flow path 48c is exhausted from the exhaust pipeline 49c.

According to the second embodiment, even if the positive drain pipeline and the negative drain pipeline are reversed, one developing treatment apparatus 50 installed in one module can perform drain treatment of the developing solution without mixing the positive developing solution and the negative developing solution as in the first embodiment. Therefore, the number of modules installed in the developing treatment apparatus can be reduced to provide an effect of reducing the size of the developing treatment apparatus as in the first embodiment.

When the developing solution pump 33a is driven and the developing solution opening/closing valve 32a is opened, driving of the developing solution pump 33b is stopped and the developing solution opening/closing valve 32b is closed, whereas when the developing solution pump 33b is driven and the developing solution opening/closing valve 32b is opened, driving of the developing solution pump 33a is stopped and the developing solution opening/closing valve 32a is closed, thereby providing an effect of increasing the efficiency of drain treatment of the developing solution without mixing the positive developing solution and the negative developing solution. Note that since the other structure in the second embodiment is the same as that of the first embodiment, the same effects as those in the first embodiment can be obtained.

Third Embodiment

Next, a developing treatment apparatus 50 of the third embodiment according to this invention will be described based on FIG. 9, FIG. 10(a), FIG. 10(b). One-dotted chain lines in FIG. 10(a), FIG. 10(b) illustrate the flow paths of the rinse solution. Note that the same contents as those of the developing treatment apparatus 50 illustrated in FIG. 3, FIG. 6(a), FIG. 6(b) are given the same numerals as those in FIG. 3, FIG. 6(a), FIG. 6(b), and the description thereof will be omitted.

Figure 9:
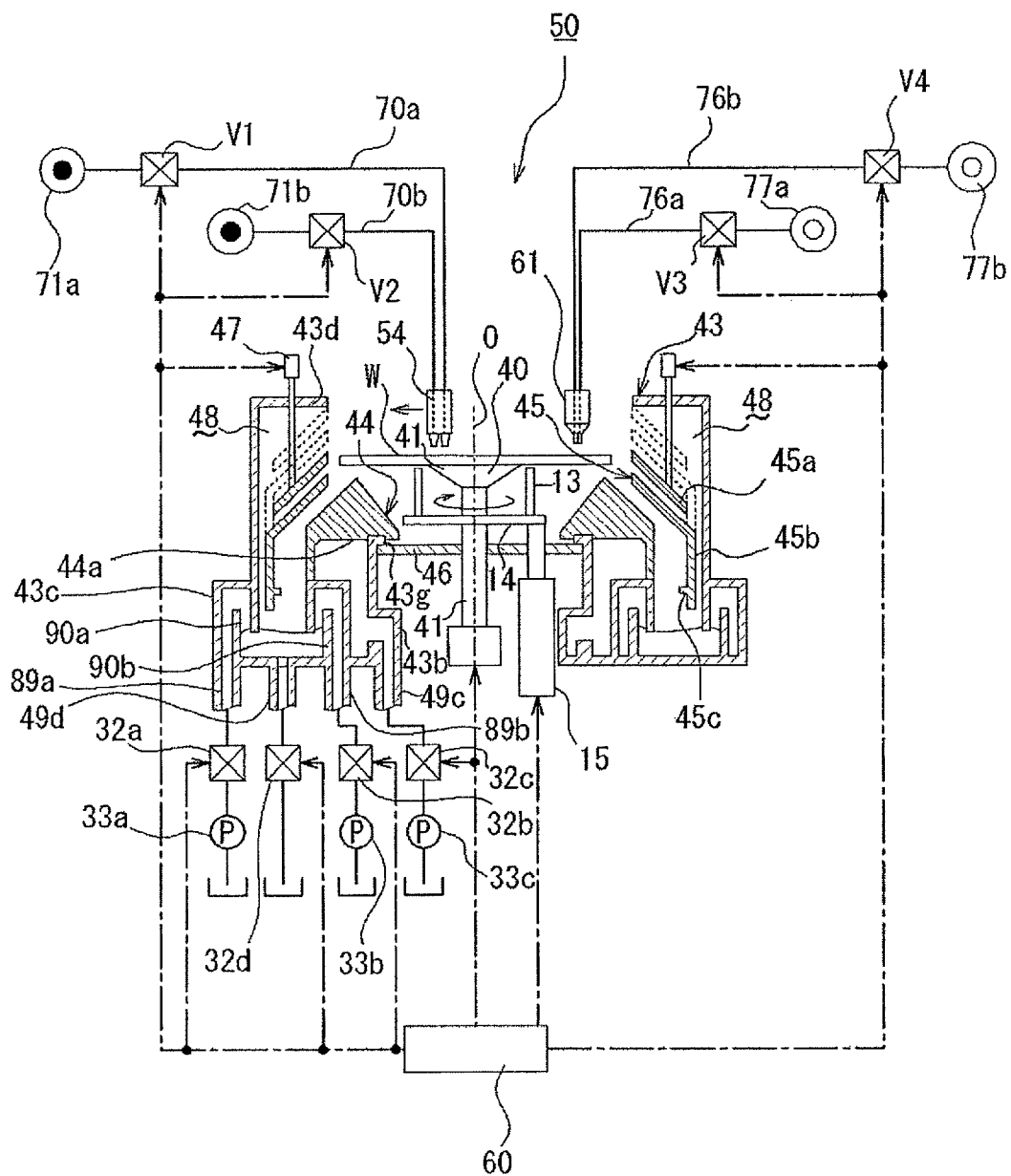
FIG. 9 is a schematic cross-sectional view illustrating a developing treatment apparatus according to a third embodiment.
Figure 10:
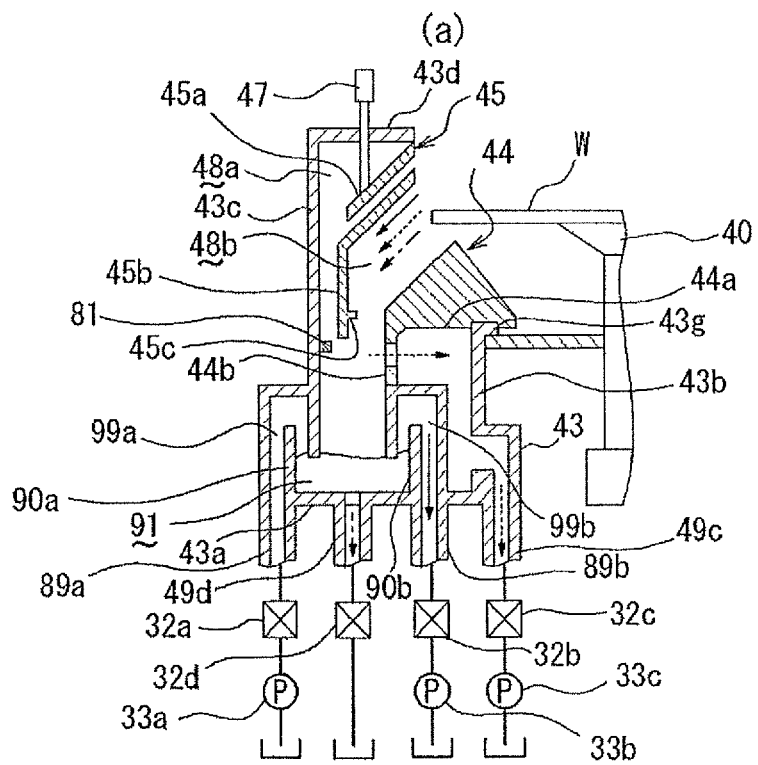
FIG. 10(a) is a schematic cross-sectional view illustrating flow paths for the developing solution and mist when the developing treatment with the positive developing solution is performed in the developing treatment apparatus according to the third embodiment.
FIG. 10(b) is a schematic cross-sectional view illustrating flow paths for the developing solution and mist when the developing treatment with the negative developing solution is performed.
Figure 10:
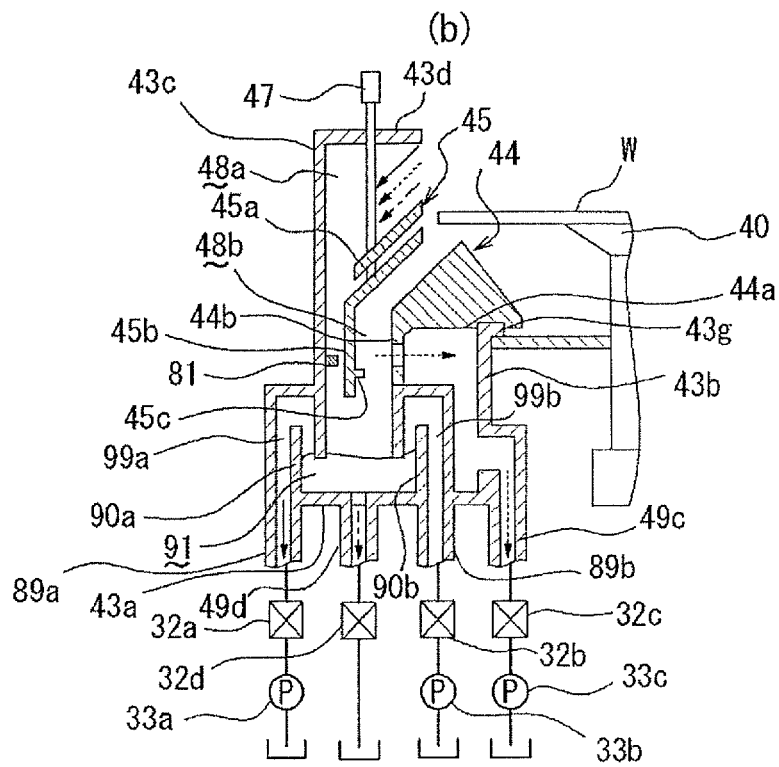

As illustrated in FIG. 9, a first developing solution drain pipeline 89a of the third embodiment is connected to the outside of an outer wall 90a concentric therewith erected on the bottom plate 43a of the cup body 43, and a second developing solution drain pipeline 89b is connected to the inside of an inner wall 90b concentric therewith erected on the bottom plate 43a of the cup body 43. Further, a portion surrounded by the outer wall 90a and the outer peripheral wall 43c corresponds to a connecting part 99a of the first developing solution drain pipeline 89a, and a portion surrounded by the inner wall 90b and the inner peripheral wall 43b corresponds to a connecting part 99b of the second developing solution drain pipeline 89b. Accordingly, the connecting part 99a of the first developing solution drain pipeline 89a and the connecting part 99b of the second developing solution drain pipeline 89b are formed to detour upward.

At the outer peripheral wall 43c of the cup body 43, a cleaning solution supply nozzle 81 is provided which supplies the cup body 43 with the rinse solution stored in a not-illustrated rinse solution storage tank. Further, between the outer wall 90a and the inner wall 90b of the third embodiment, a cleaning solution drain pipeline (sometimes referred to as a rinse solution drain pipeline) 49d that drains the rinse solution is provided, and the rinse solution drain pipeline 49d is provided with a cleaning solution opening/closing valve 32d.

When the positive rinse solution is supplied to the wafer W coated with the positive developing solution when the movable cup 45 has been moved up (in the case of the positive developing treatment) as illustrated in FIG. 10(a), the positive rinse solution scattering from the wafer W is introduced into the inner peripheral flow path 48b. The introduced positive rinse solution is stored in a lower flow path 91 surrounded by the outer wall 90a, the inner wall 90b, and the bottom plate 43a.

On the other hand, when the negative rinse solution is supplied to the wafer W coated with the negative developing solution when the movable cup 45 has been moved down (in the case of the negative developing treatment) as illustrated in FIG. 10(b), the negative rinse solution scattering from the wafer W is introduced into the outer peripheral flow path 48a. The introduced negative rinse solution is stored in the lower flow path 91.

Further, a rinse solution to clean the positive developing solution or the negative developing solution adhering to the cup body 43 when the positive developing solution or the negative developing solution is supplied to the wafer W is supplied from the cleaning solution supply nozzle 81 and stored in the lower flow path 91.

Then, by closing the developing solution opening/closing valves 32a, 32b and opening the cleaning solution opening/closing valve 32d, the positive rinse solution or the negative rinse solution stored in the lower flow path 91 is drained from the rinse solution drain pipeline 49d.

The above-described supply of the rinse solution from the cleaning solution supply nozzle 81, storage of the rinses solution in the lower flow path 91 and draining of the rinse solution are performed after the positive developing solution, the negative developing solution or the positive rinse solution is supplied to the wafer W. In this event, in order to reduce the developing treatment time on the wafer W developed in the developing unit (DEV) 25, the supply of the rinse solution from the cleaning solution supply nozzle 81, storage of the rinses solution in the lower flow path 91 and draining of the rinse solution may be performed at the same time as the transfer of the wafer W.

According to the third embodiment, the bottom plate 43a, the outer wall 90a, the inner wall 90b and the outer peripheral wall 43c surrounding the lower flow path 91 can be cleaned by storing the rinse solution in the lower flow path 91 and draining the rinse solution from the rinse solution drain pipeline 49d, thereby providing an effect of preventing mixture of the positive developing solution, the negative developing solution, and the negative rinse solution in addition to the effects obtained in the first embodiment. Note that since the other structure in the third embodiment is the same as that of the first embodiment, the same effects as those in the first embodiment can be obtained.

Fourth Embodiment

Next, a developing treatment apparatus 50 of the fourth embodiment according to this invention will be described based on FIG. 11. Note that the same contents as those of the developing treatment apparatus 50 illustrated in FIG. 3 are given the same numerals as those in FIG. 3, and the description thereof will be omitted.

Figure 11:
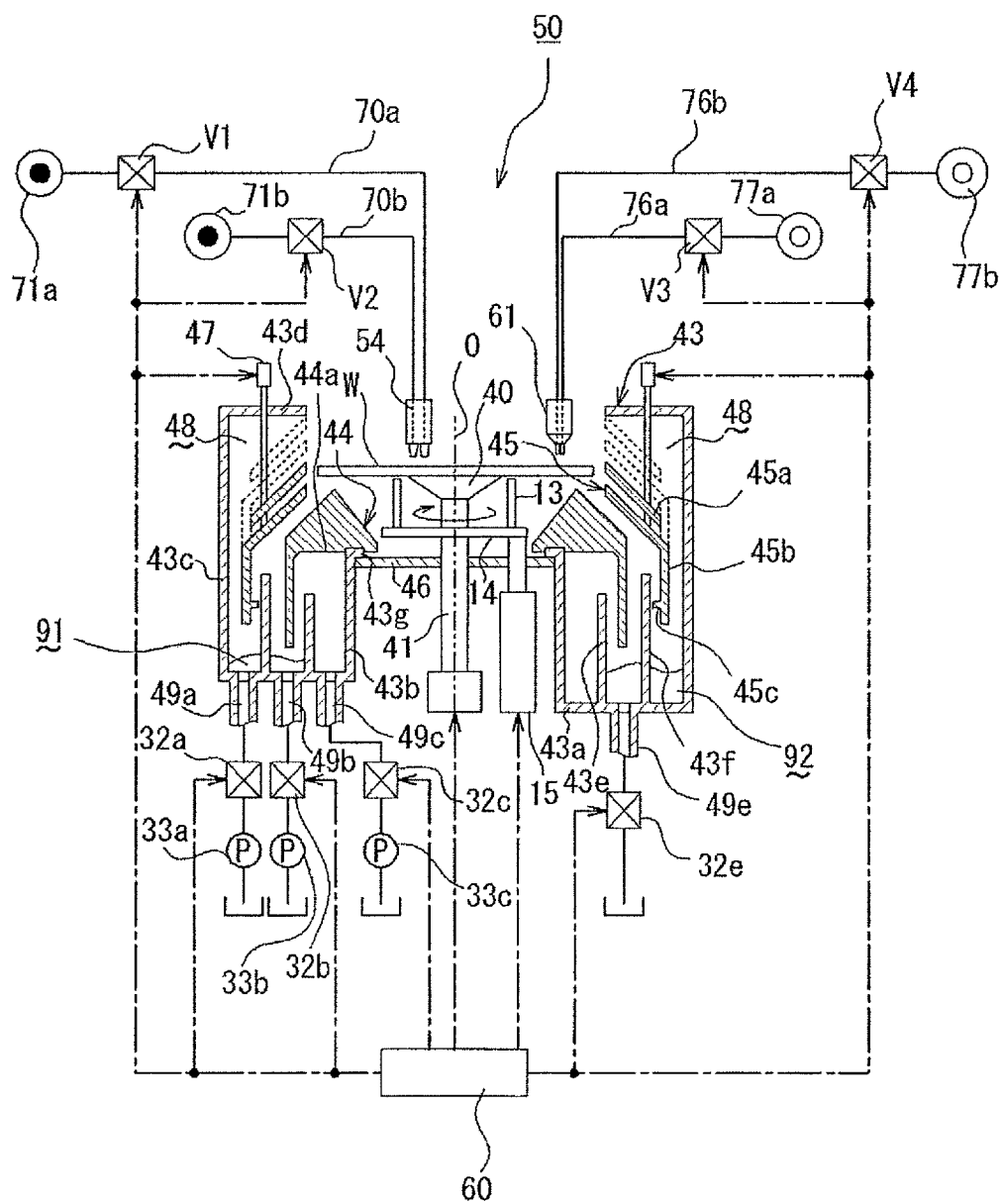
FIG. 11 is a schematic cross-sectional view illustrating a developing treatment apparatus according to a fourth embodiment.

As illustrated in FIG. 11, a bottom plate 43a of a cup body 43 of the fourth embodiment is formed in an inclined shape. Therefore, the rinse solution stored in the lower flow path 91 on the left side in FIG. 11 flows through the cup body 43 formed in the inclined shape and then flows into a lower flow path 92 on the right side in FIG. 11. By opening a cleaning solution opening/closing valve 32e provided on a cleaning solution drain pipeline 49e formed at the bottom plate 43a, the rinse solution stored in the lower flow path 92 is drained from the rinse solution drain pipeline 49e.

According to the fourth embodiment, the rinse solution can be circulated in the whole cup body 43 by spirally circulating the rinse solution stored in the lower flow path 91 toward the lower flow path 92, thereby providing an effect of efficiently cleaning the bottom plate 43a, the outer wall 43c and the inner wall 43b surrounding the lower flow paths 91, 92 using the rinse solution in addition of the effects obtained in the first embodiment. Note that since the other structure in the fourth embodiment is the same as that in the first embodiment, the same effects as those in the first embodiment can be obtained.

Fifth Embodiment

Next, a developing treatment apparatus 50 of the fifth embodiment according to this invention will be described based on FIG. 12, FIG. 13. Note that the same contents as those of the developing treatment apparatus 50 illustrated in FIG. 3, FIG. 6(a), FIG. 6(b) are given the same numerals as those in FIG. 3, FIG. 6(a), FIG. 6(b), and the description thereof will be omitted.

Figure 12:
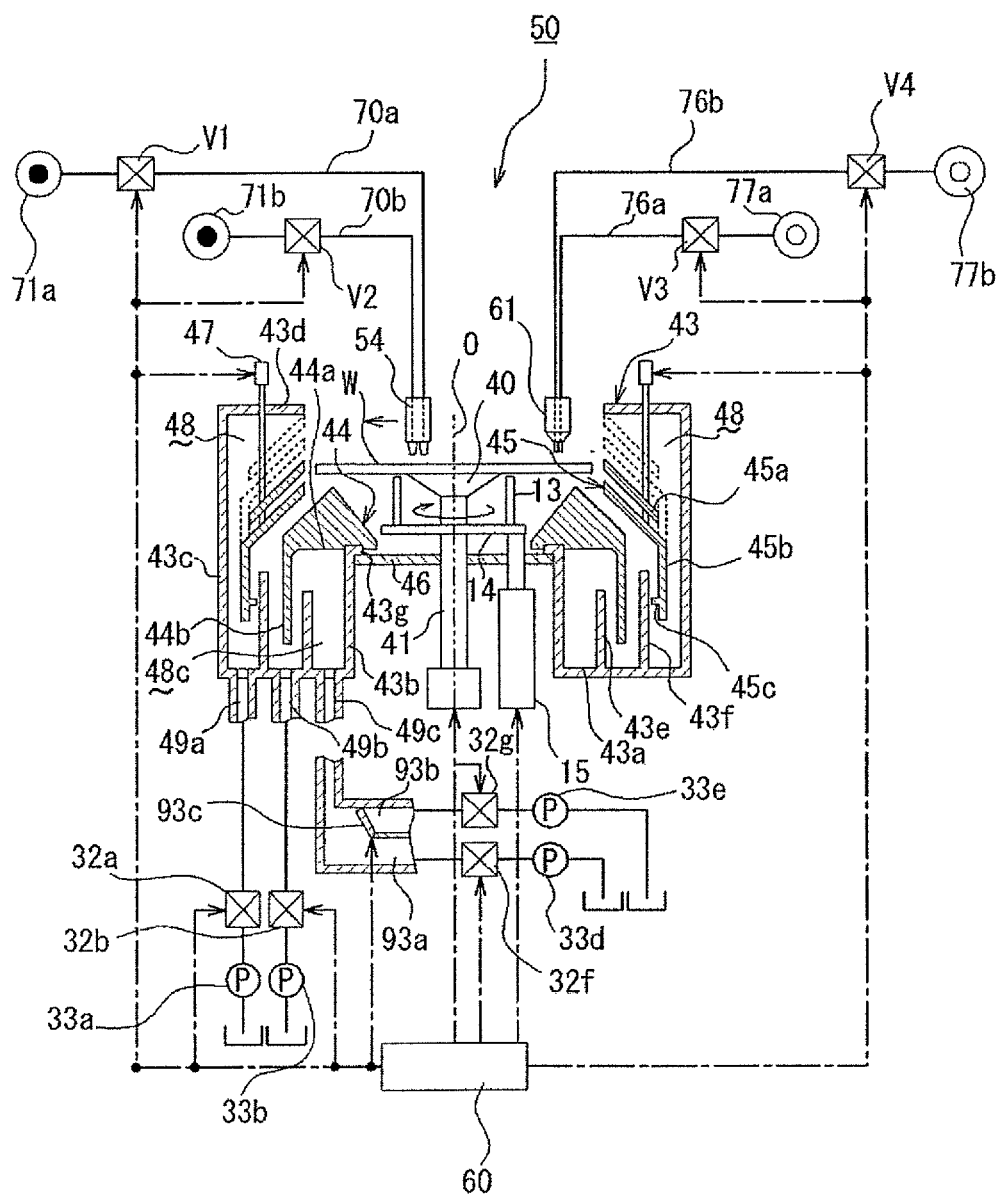
FIG. 12 is a schematic cross-sectional view illustrating a developing treatment apparatus according to a fifth embodiment.
Figure 13:
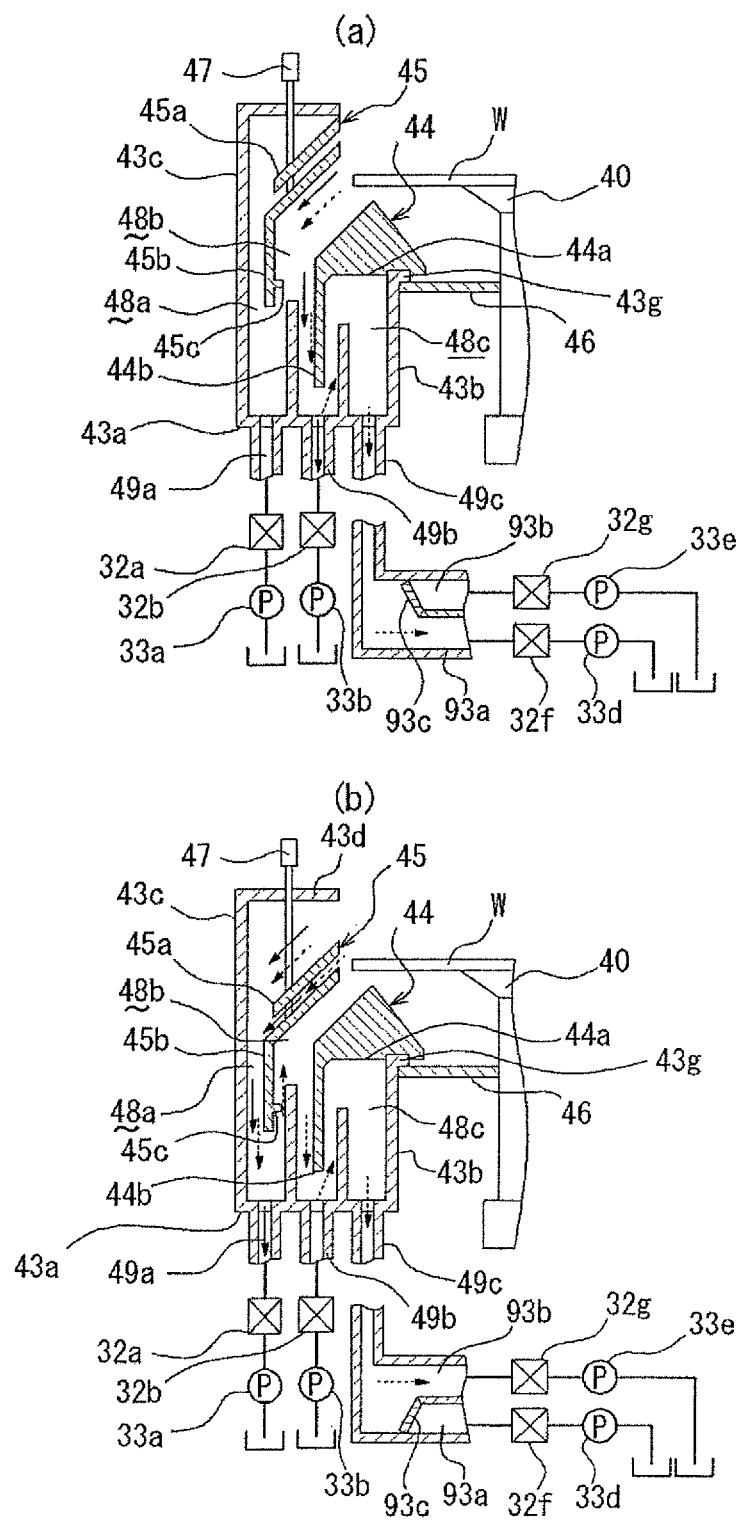
FIG. 13(a) is a schematic cross-sectional view illustrating flow paths for the developing solution and mist when the developing treatment with the positive developing solution is performed in the developing treatment apparatus according to the fifth embodiment.
FIG. 13(b) is a schematic cross-sectional view illustrating flow paths for the developing solution and mist when the developing treatment with the negative developing solution is performed.

As illustrated in FIG. 12, on the secondary side of the exhaust pipeline 49c of the fifth embodiment, a positive exhaust pipeline 93a to exhaust the mist generated when using the positive developing solution and a negative exhaust pipeline 93b to exhaust the mist generated when using the negative developing solution are provided. Further, the exhaust pipeline 49c is provided with a switching damper 93c that causes only one of the positive exhaust pipeline 93a and the negative exhaust pipeline 93b to communicate with the exhaust flow path 48c of the cup body 43. The switching damper 93c is connected to the controller 60 and operates to close one of the positive exhaust pipeline 93a and the negative exhaust pipeline 93b based on the signal from the controller 60. Further, the positive exhaust pipeline 93a is provided with an exhaust opening/closing valve 32f and an exhaust pump 33d, and the negative exhaust pipeline 93b is provided with an exhaust opening/closing valve 32g and an exhaust pump 33e.

When the movable cup 45 has been moved up (in the case of the positive developing treatment) as illustrated in FIG. 13(a), the positive developing solution scattering from the wafer W is introduced into the inner peripheral flow path 48b and the mist is introduced into the exhaust flow path 48c. In this case, based on the signal from the controller 60 corresponding to a switching damper control unit, the switching damper 93c closes the negative exhaust pipeline 93b, so that the positive exhaust pipeline 93a communicates with the cup body 43. Further, the exhaust opening/closing valve 32f is opened, the exhaust pump 33d is driven, and the exhaust opening/closing valve 32g is closed. Therefore, the mist staying in the exhaust flow path 48c is exhausted via the positive exhaust pipeline 93a.

Next, when the movable cup 45 has been moved down (in the case of the negative developing treatment) as illustrated in FIG. 13(b), the negative developing solution scattering from the wafer W is introduced into the outer peripheral flow path 48a and the mist is introduced into the exhaust flow path 48c. In this case, the switching damper 93c closes the positive exhaust pipeline 93a, so that the negative exhaust pipeline 93b communicates with the cup body 43. Further, the exhaust opening/closing valve 32g is opened, the exhaust pump 33e is driven, and the exhaust opening/closing valve 32f is closed. Therefore, the mist staying in the exhaust flow path 48c is exhausted via the negative exhaust pipeline 93b.

According to the fifth embodiment, when the mist staying in the exhaust flow path 48c is caused from the scattering positive developing solution, the mist is exhausted via the positive exhaust pipeline 93a. On the other hand, when the mist staying in the exhaust flow path 48c is caused from the scattering negative developing solution, the mist is exhausted via the negative exhaust pipeline 93b. Therefore, it is possible to obtain an effect of being able to separately exhausting the mist caused from the positive developing solution and the mist caused from the negative developing solution without mixing them. Note that since the other structure in the fifth embodiment is the same as that of the first embodiment, the same effects as those in the first embodiment can be obtained.

Sixth Embodiment

Next, a developing treatment apparatus 50 of the sixth embodiment according to this invention will be described based on FIG. 14A, FIG. 14B.

Figure 14A:
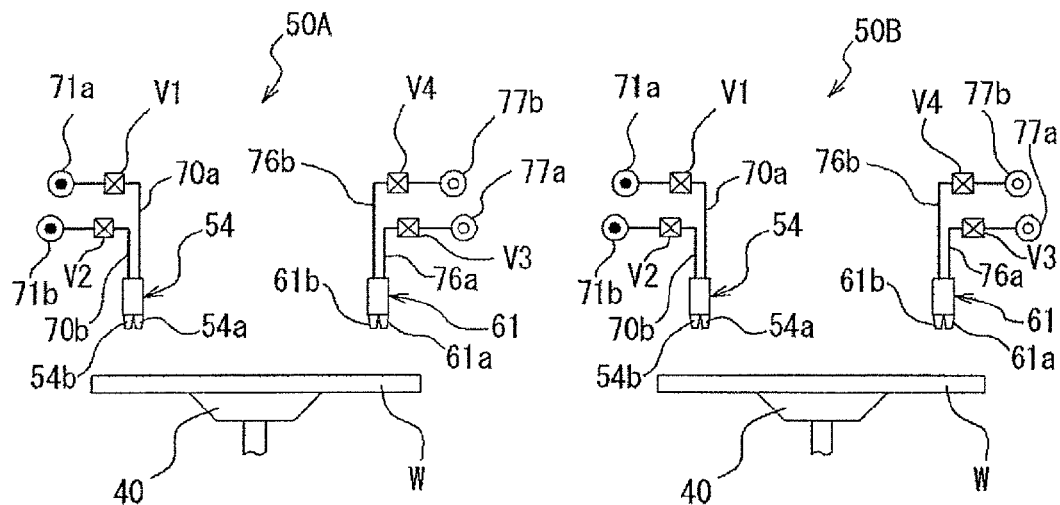
FIG. 14A is a schematic side view illustrating an example of a module in which two developing treatment apparatuses are provided.
Figure 14B:
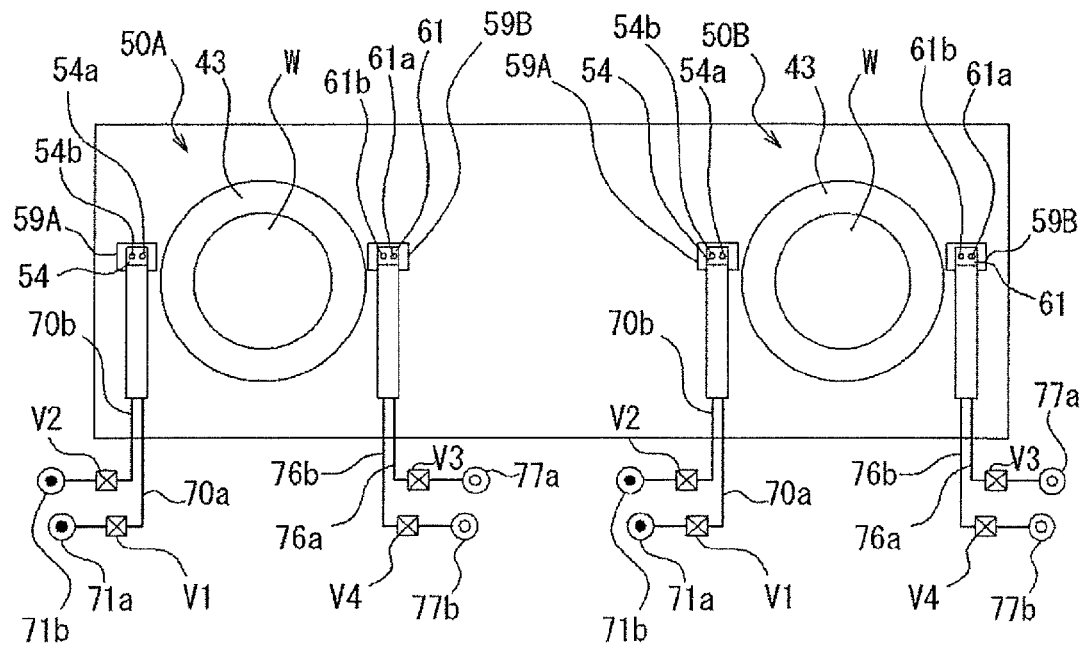
FIG. 14B is a schematic plan view illustrating the example of the module in which the two developing treatment apparatuses are provided.

As illustrated in FIG. 14A, FIG. 14B, two developing treatment apparatuses 50A, 50B are provided in one module in the sixth embodiment. In the developing treatment apparatus 50A, the positive developing solution supply nozzle 54a capable of supplying the positive developing solution and the positive rinse solution supply nozzle 61a capable of supplying the positive rinse solution are provided. In the developing treatment apparatus 50B, the negative developing solution supply nozzle 54b capable of supplying the negative developing solution and the negative rinse solution supply nozzle 61b capable of supplying the negative rinse solution are provided.

To the developing solution supply nozzle 54, the developing solution supply pipes 70a, 70b are coupled, and the developing solution supply pipes 70a, 70b are provided with the opening/closing valves V1, V2 and connected to the developing solution supply sources 71a, 71b. Further, to the rinse nozzle 61, the rinse solution supply pipes 76a 76b are coupled, and the rinse solution supply pipes 76a 76b are provided with the opening/closing valves V3, V4 and connected to the rinse solution supply sources 77a, 77b. Further, the first developing solution drain pipeline and the second developing solution drain pipeline need to be separately provided in the respective developing treatment apparatuses 50A, 50B.

Accordingly, the supply of the positive developing solution to the wafer W in the developing treatment apparatus 50A is performed by the positive developing solution supply nozzle 54a and the supply of the positive rinse solution is performed by the positive rinse solution supply nozzle 61a. The supply of the negative developing solution to the wafer W in the developing treatment apparatus 50B is performed by the negative developing solution supply nozzle 54b and the supply of the negative rinse solution is performed by the negative rinse solution supply nozzle 61b.

According to the sixth embodiment, when the two developing treatment apparatuses 50A, 50B are installed in one module, the developing treatment and the rinse treatment can be performed at the same time in each of the developing treatment apparatuses 50A, 50B. Therefore, an effect of efficiently performing the developing treatment and the rinse treatment can be obtained in addition to the effects obtained in the first embodiment. For example, when both the wafer W which the develop treatment with the positive developing solution is applied and the wafer W which the develop treatment with the negative developing solution is applied are carried into the processing system, the developing treatment apparatuses 50A is used for the develop treatment with the positive developing solution, and the developing treatment apparatuses 50B is used for the develop treatment with the negative developing solution. Herewith, the develop treatment can be performed efficiently. On the other hand, when only the wafer W which the develop treatment with the positive developing solution is applied carried into the processing system, both the developing treatment apparatuses 50A, 50B are used for the develop treatment with the positive developing solution, and when only the wafer W which the develop treatment with the negative developing solution is applied carried into the processing system, both the developing treatment apparatuses 50A, 50B are used for the develop treatment with the negative developing solution. As a result, overall processing capacity of the processing system can be increased.

Seventh Embodiment

Next, a developing treatment apparatus 50 of the seventh embodiment according to this invention will be described based on FIG. 15A, FIG. 15B.

Figure 15A:
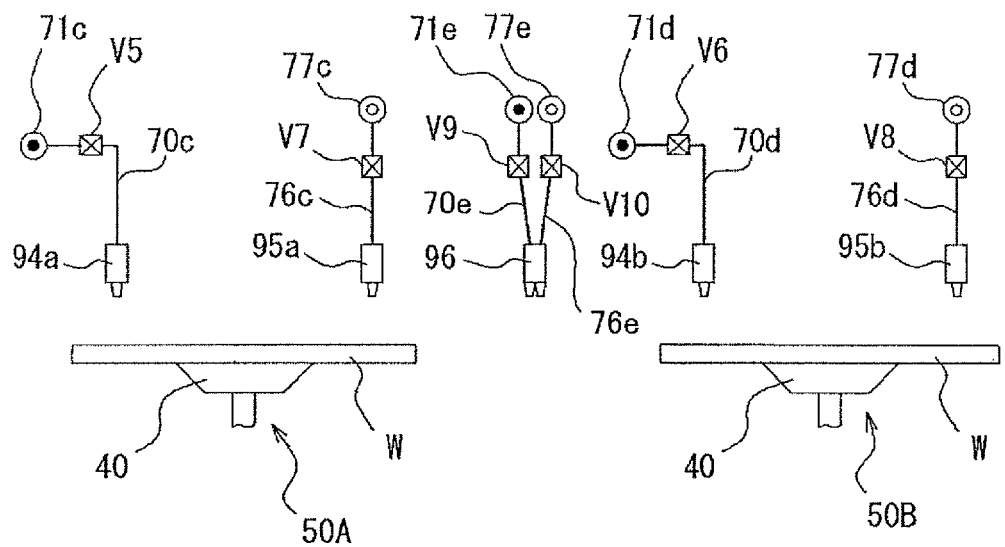
FIG. 15A is a schematic side view illustrating another example of a module in which two developing treatment apparatuses are provided.
Figure 15B:
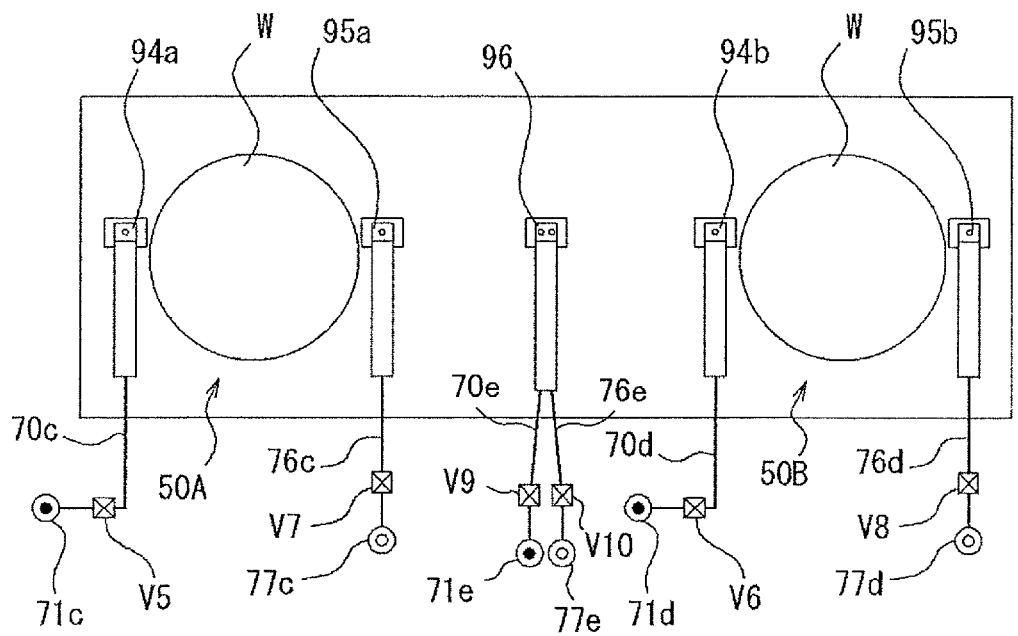
FIG. 15B is a schematic plan view illustrating the other example of the module in which the two developing treatment apparatuses are provided.

As illustrated in FIG. 15A, FIG. 15B, two developing treatment apparatuses 50A, 50B are installed in one module in the seventh embodiment. In the developing treatment apparatuses 50A, 50B, positive developing solution supply nozzles 94a, 94b capable of supplying the positive developing solution and positive rinse solution supply nozzles 95a, 95b capable of supplying the positive rinse solution are provided respectively. Further, a negative treatment solution supply nozzle 96 capable of supplying the negative developing solution and the negative rinse solution is shared between the developing treatment apparatuses 50A, 50B.

To the positive developing solution supply nozzles 94a, 94b, positive developing solution supply pipes 70c, 70d are connected. Further, the positive developing solution supply pipe 70c is provided with an opening/closing valve V5 and connected with a positive developing solution supply source 71c, and the positive developing solution supply pipe 70d is provided with an opening/closing valve V6 and connected with a positive developing solution supply source 71d.

To the positive rinse solution supply nozzles 95a, 95b, positive rinse solution supply pipes 76c, 76d are connected. The positive rinse solution supply pipe 76c is provided with an opening/closing valve V7 and connected with a positive rinse solution supply source 77c, and the positive rinse solution supply pipe 76d is provided with an opening/closing valve V8 and connected with a positive rinse g solution supply source 77d. Further, to the negative treatment solution supply nozzle 96, a negative developing solution supply pipe 70e and a negative rinse solution supply pipes 76e are connected. The negative developing solution supply pipe 70e and the negative rinse solution supply pipes 76e are provided with opening/closing valves V9, V10 and connected with a negative developing solution supply source 71e and a negative rinse solution supply source 77e.

Accordingly, in the developing treatment apparatus 50A, the supply of the positive developing solution to the wafer W is performed by the positive developing solution supply nozzle 94a and the supply of the positive rinse solution is performed by the positive rinse solution supply nozzle 95a. In the developing treatment apparatus 50B, the supply of the positive developing solution to the wafer W is performed by the positive developing solution supply nozzle 94b and the supply of the positive rinse solution is performed by the positive rinse solution supply nozzle 95b. On the other hand, the supply of the negative developing solution and the negative rinse solution to the wafer W in the developing treatment apparatuses 50A, 50B is performed by the negative treatment solution supply nozzle 96.

According to the seventh embodiment, a set of the positive developing nozzle and rinse nozzle are provided for each of the developing treatment apparatuses 50A, 50B and the negative treatment solution supply nozzle 96 shared between the developing treatment apparatuses 50A, 50B is provided, thus ensuring that an existing developing treatment apparatus using the positive developing solution can cope with the positive developing solution and the negative developing solution by including the negative treatment solution supply nozzle 96. Accordingly, an effect of capable of easily assembling the developing treatment apparatus capable of efficiently performing the developing treatment and the rinse treatment can be obtained in addition to the effects obtained in the first embodiment.

<Backflow Prevention Mechanism for Drainage>

Figure 16:
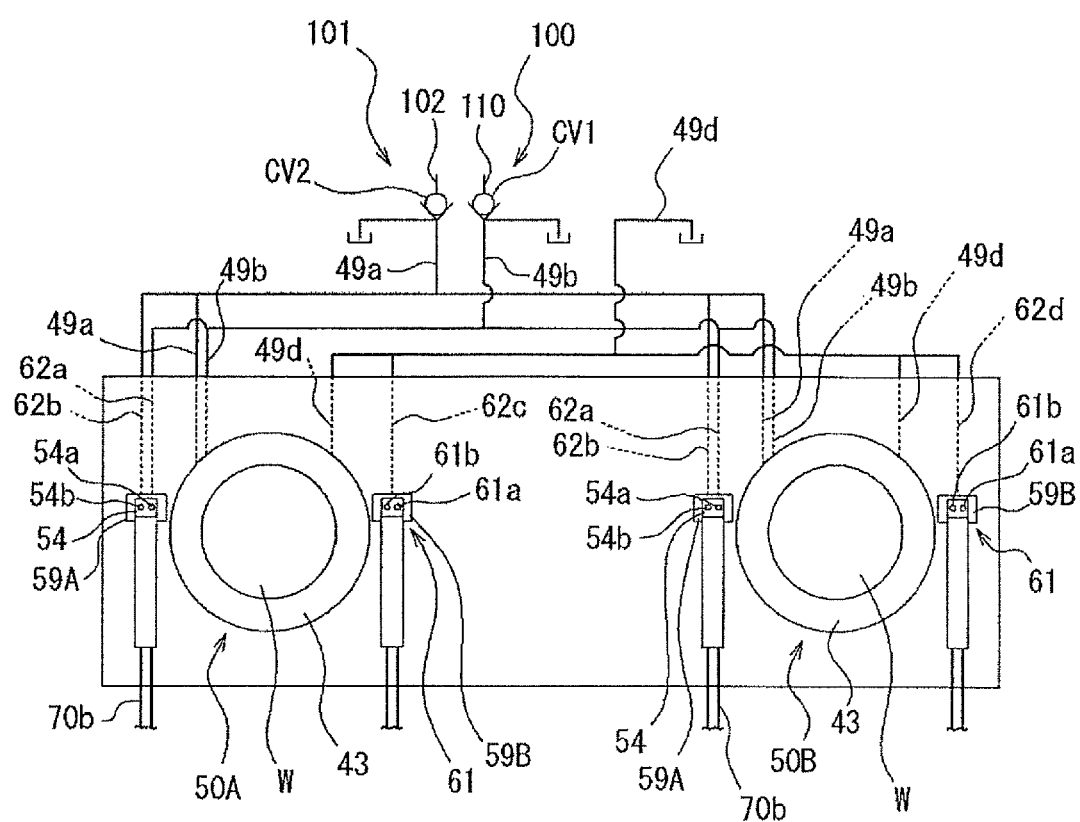
FIG. 16 is a schematic plane view illustrating a backflow prevention mechanism for drainage.

Next, a backflow prevention mechanism 100 for drainage will be described based on FIG. 16. As illustrated in FIG. 16, the backflow prevention mechanism 100 for the positive developing solution is provided at the second developing solution drain pipeline 49b and includes an exhaust port 110 that exhausts air inside the second developing solution drain pipeline 49b and a check valve CV1 provided at the exhaust port 110. Further, a backflow prevention mechanism 101 for the negative developing solution is provided at the first developing solution drain pipeline 49a and includes an exhaust port 102 that exhausts air inside the first developing solution drain pipeline 49a and a check valve CV2 provided at the exhaust port 102.

To the first developing solution drain pipeline 49a and the second developing solution drain pipeline 49b, the waiting parts 59A for the developing nozzles 54 provided in the developing treatment apparatuses 50A, 50B via the drain pipelines 62a, 62b are connected. Further, to the first developing solution drain pipeline 49a and the second developing solution drain pipeline 49b, not-illustrated cup bodies provided in the respective developing treatment apparatuses 50A, 50B are connected. Further, to the rinse solution drain pipeline 49d, the waiting parts 59B for the rinse solution supply nozzles via drain pipelines 62c, 62d are connected.

The backflow prevention mechanisms 100, 101 having the exhaust ports 110, 102 at the second developing solution drain pipeline 49b and the first developing solution drain pipeline 49a are provided as described above, so that even if pressure is applied on the drainage flowing through the first developing solution drain pipeline 49a and the second developing solution drain pipeline 49b, the pressure can be released through the exhaust ports 102, 110. This makes it possible to prevent backflow of the drainage flowing through the first developing solution drain pipeline 49a and the second developing solution drain pipeline 49b.

Next, as for the positive developing treatment and the negative developing treatment in this invention, the case where each of them is continuously performed and the case where they are performed variously changed will be described referring to FIG. 17 to FIG. 20.

<Positive-Positive Developing Treatments>

Figure 17:
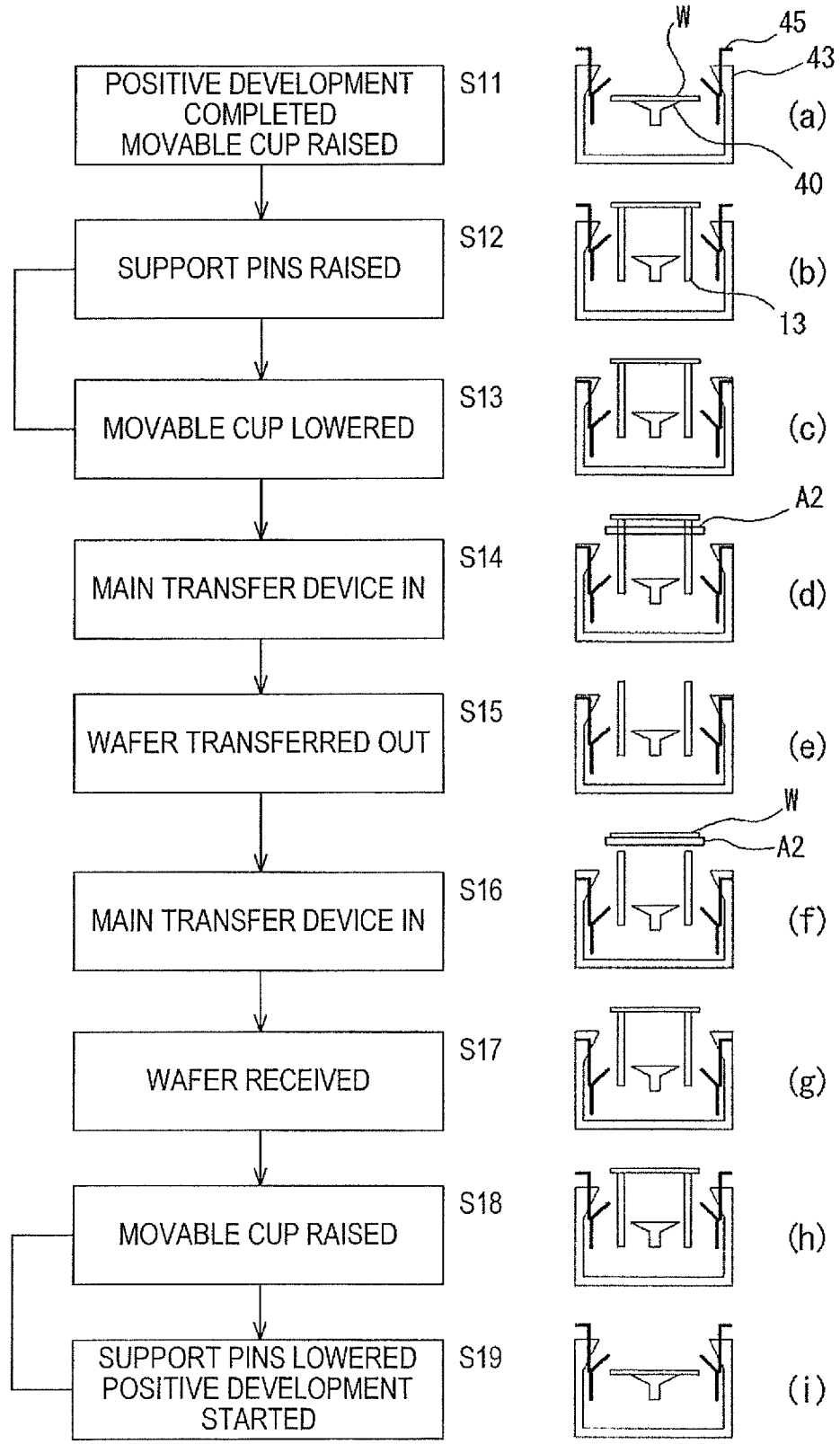
FIG. 17 is a flowchart and schematic views illustrating operation aspects of a movable cup and support pins supporting a wafer when the positive developing treatment in this invention is continuously performed.

When the positive developing treatment is continuously performed, the movable cup 45 has been moved up at the point in time when the positive developing treatment is completed as illustrated in FIG. 17 (S11, see FIG. 17(a)). In this state, the support pins 13 are raised to move the wafer W on the spin chuck 40 to a wafer delivery position (S12, see FIG. 17(b)). In this state, since the movable cup 45 has been raised, it is possible to prevent particles from entering the movable cup 45 and adhering to the wafer W due to gas flow along with the raising of the support pins 13.

After the support pins 13 are raised, the movable cup 45 is lowered (S13, see FIG. 17(c)). Note that, in this case, the raising of the support pins 13 and the lowering of the movable cup 45 may be performed at the same time. By performing the raising of the support pins 13 and the lowering of the movable cup 45 at the same time, time can be reduced.

Then, the main transfer device A2 outside the developing apparatus enters the apparatus, and the wafer W supported by the support pins 13 is delivered to the main transfer device A2 (S14, see FIG. 17(d)). Thereafter, the wafer W is transferred out by the main transfer device A2 (S15, see FIG. 17(e)).

Then, the main transfer device A2 holding an undeveloped wafer W enters the apparatus (S16, see FIG. 17(i)), and the support pins 13 receive the wafer W (S17, see FIG. 17(g)). Thereafter, the main transfer device A2 retreats from the apparatus.

Then, after the movable cup 45 is raised (S18, see FIG. 17(h)), the support pins 13 are lowered to mount the wafer W supported by the support pins 13 onto the spin chuck 40, and the next positive developing treatment is started (S19, see FIG. 17(i)). By lowering the support pins 13 with the movable cup 45 raised as described above, it is possible to prevent particles from entering the movable cup 45 and adhering to the wafer W due to gas flow along with the lowering of the support pins 13.

Note that, the raising of the movable cup 45 and the lowering of the support pins 13 may be performed at the same time. Thus, time can be reduced.

<Negative-Negative Developing Treatments>

Figure 18:
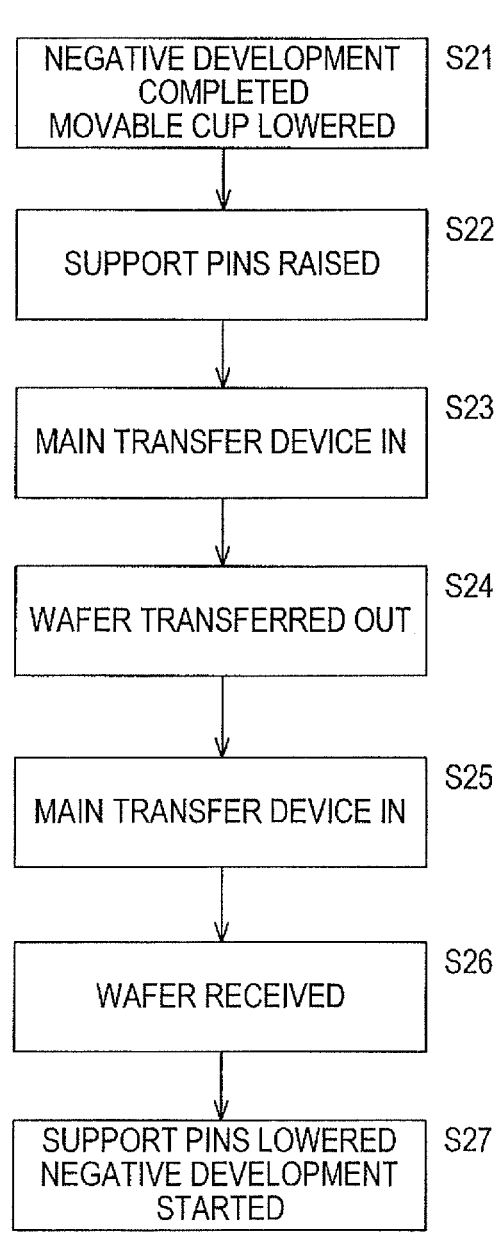
FIG. 18 is a flowchart and schematic views illustrating operation aspects of the movable cup and the support pins supporting a wafer when the negative developing treatment in this invention is continuously performed.
Figure 18:
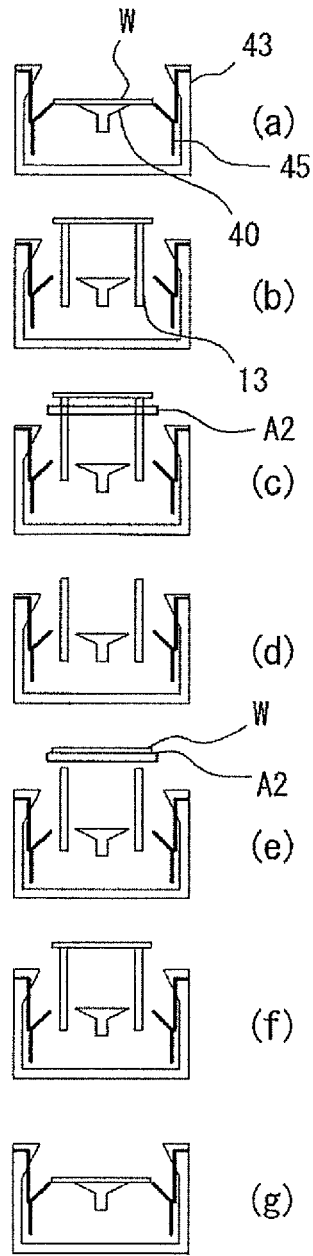

When the negative developing treatment is continuously performed, the movable cup 45 has been moved down at the point in time when the negative developing treatment is completed as illustrated in FIG. 18 (S21, see FIG. 18(a)). In this state, the support pins 13 are raised to move the wafer W on the spin chuck 40 to the wafer delivery position (S22, see FIG. 18(b)).

Then, the main transfer device A2 outside the developing apparatus enters the apparatus, and the wafer W supported by the support pins 13 is delivered to the main transfer device A2 (S23, see FIG. 18(c)). Thereafter, the wafer W is transferred out by the main transfer device A2 (S24, see FIG. 18(d)).

Then, the main transfer device A2 holding an undeveloped wafer W enters the apparatus (S25, see FIG. 18(e)), and the support pins 13 receive the wafer W (S26, see FIG. 18(f)). Thereafter, the main transfer device A2 retreats from the apparatus.

Then, the support pins 13 are lowered to mount the wafer W supported by the support pins 13 onto the spin chuck 40, and the next negative developing treatment is started (S27, see FIG. 18(g)).

<Positive-Negative Developing Treatments>

Figure 19:
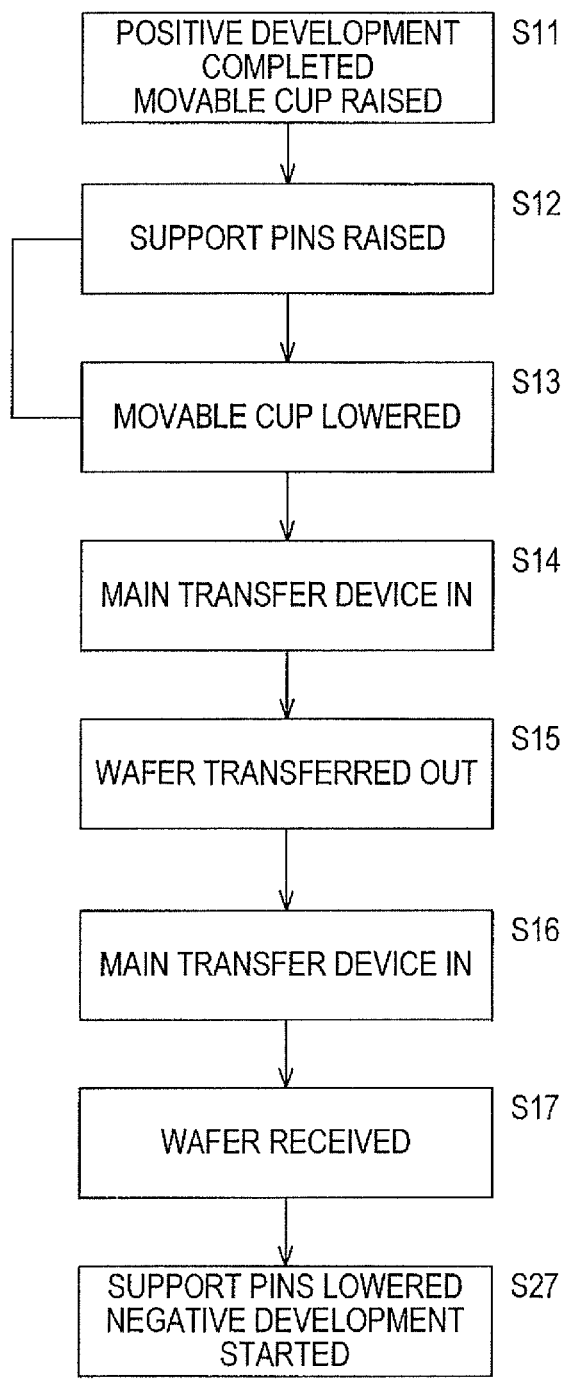
FIG. 19 is a flowchart and schematic views illustrating operation aspects of the movable cup and the support pins supporting a wafer when the negative developing treatment is performed after the positive developing treatment in this invention.
Figure 19:
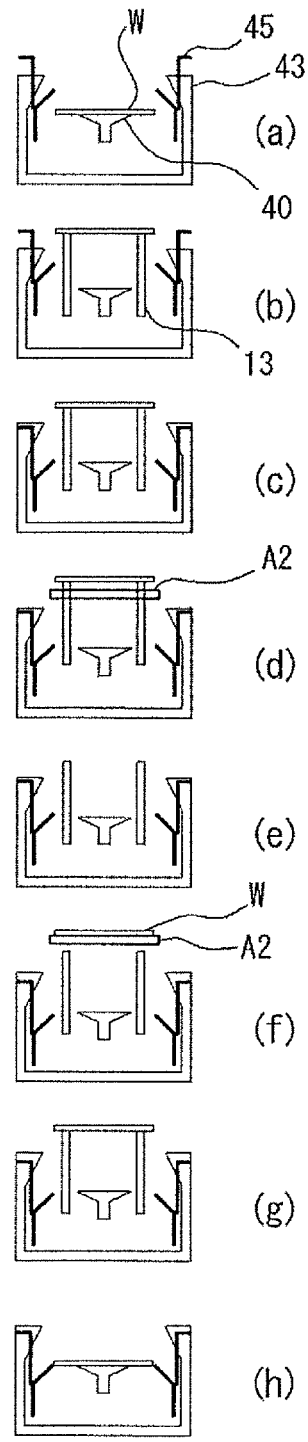

When the negative developing treatment is performed after the positive developing treatment, the treatments are performed in an operation procedure illustrated in FIG. 19. Here, steps common to the positive-positive developing treatments and the negative-negative developing treatments will be described using the same numerals.

At the point in time when the positive developing treatment is completed, the movable cup 45 has been raised (S11, see FIG. 19(a)). In this state, the support pins 13 are raised to move the wafer W on the spin chuck 40 to the wafer delivery position (S12, see FIG. 19(b)). In this state, since the movable cup 45 has been raised, it is possible to prevent particles from entering the movable cup 45 and adhering to the wafer W due to gas flow along with the raising of the support pins 13.

After the support pins 13 are raised, the movable cup 45 is lowered (S13, see FIG. 19(c)). Note that, in this case, the raising of the support pins 13 and the lowering of the movable cup 45 may be performed at the same time. By performing the raising of the support pins 13 and the lowering of the movable cup 45 at the same time, time can be reduced.

Then, the main transfer device A2 outside the developing apparatus enters the apparatus, and the wafer W supported by the support pins 13 is delivered to the main transfer device A2 (S14, see FIG. 19(d)). Thereafter, the wafer W is transferred out by the main transfer device A2 (S15, see FIG. 19(e)).

Then, the main transfer device A2 holding an undeveloped wafer W enters the apparatus (S16, see FIG. 19(f)), and the support pins 13 receive the wafer W (S17, see FIG. 19(g)). Thereafter, the main transfer device A2 retreats from the apparatus.

Then, the support pins 13 are lowered to mount the wafer W supported by the support pins 13 onto the spin chuck 40, and the next negative developing treatment is started (S27, see FIG. 19(h)).

<Negative-Positive Developing Treatments>

Figure 20:
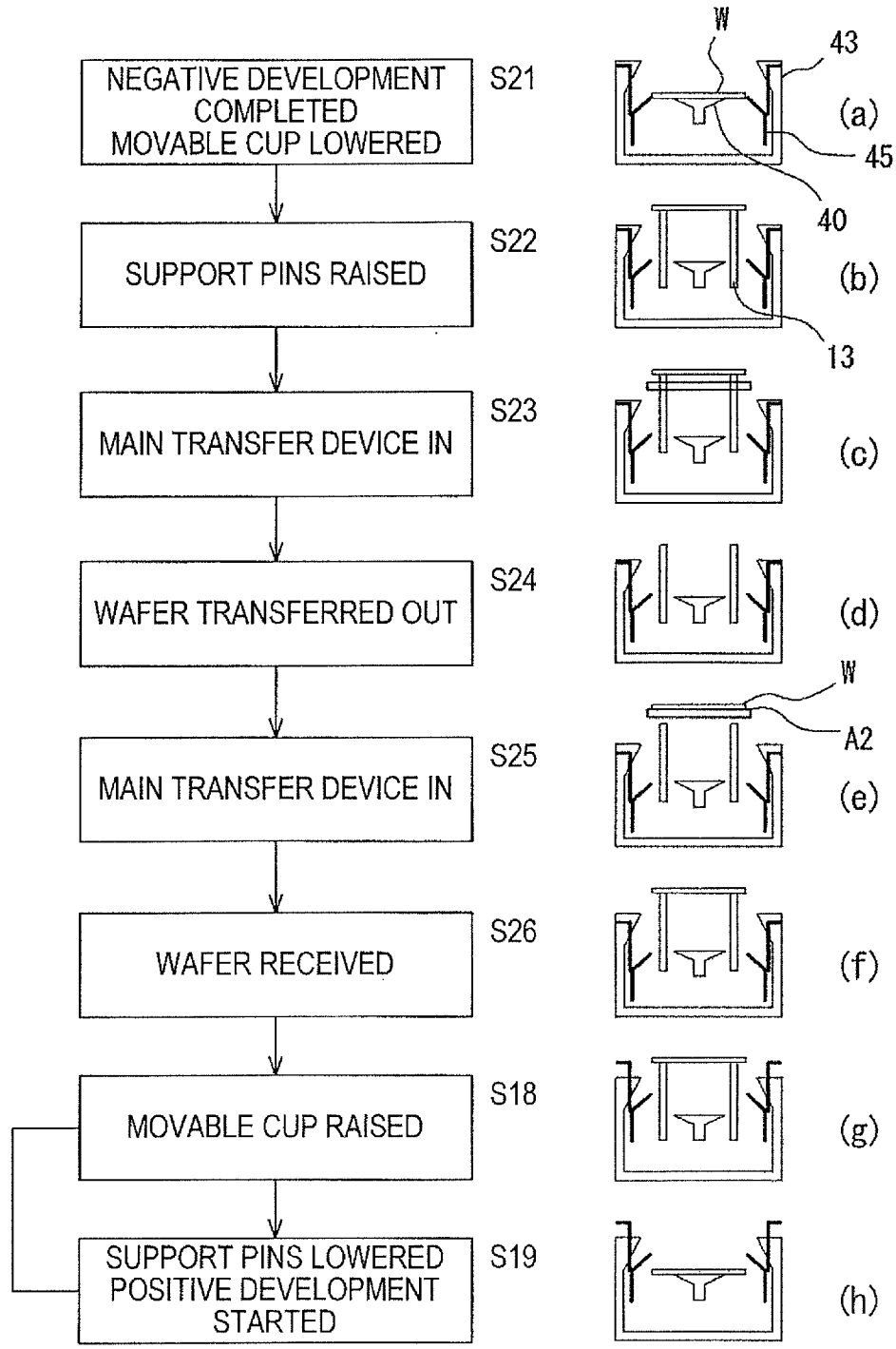
FIG. 20 is a flowchart and schematic views illustrating operation aspects of the movable cup and the support pins supporting a wafer when the positive developing treatment is performed after the negative developing treatment in this invention.

When the positive developing treatment is performed after the negative developing treatment, the treatments are performed in an operation procedure illustrated in FIG. 20. Here, steps common to the positive-positive developing treatments and the negative-negative developing treatments will be described using the same numerals.

At the point in time when the negative developing treatment is completed, the movable cup 45 has been lowered (S21, see FIG. 20(a)). In this state, the support pins 13 are raised to move the wafer W on the spin chuck 40 to the wafer delivery position (S22, see FIG. 20(b)).

Then, the main transfer device A2 outside the developing apparatus enters the apparatus, and the wafer W supported by the support pins 13 is delivered to the main transfer device A2

(S23, see FIG. 20(c)). Thereafter, the wafer W is transferred out by the main transfer device A2 (S24, see FIG. 20(d)).

Then, the main transfer device A2 holding an undeveloped wafer W enters the apparatus (S25, see FIG. 20(e)), and the support pins 13 receive the wafer W (S26, see FIG. 20(f)). Thereafter, the main transfer device A2 retreats from the apparatus.

Then, after the movable cup 45 is raised (S18, see FIG. 20(g)), the support pins 13 are lowered to mount the wafer W supported by the support pins 13 onto the spin chuck 40, and the next positive developing treatment is started (S19, see FIG. 20(h)). By lowering the support pins 13 with the movable cup 45 raised, it is possible to prevent particles from entering the movable cup 45 and adhering to the wafer W due to gas flow along with the lowering of the support pins 13.

Note that, the raising of the movable cup 45 and the lowering of the support pins 13 may be performed at the same time. Thus, time can be reduced.

Other Embodiments

Examples of embodiments of this invention have been described, this invention is not limited to the embodiments but can take various forms. Though the positive developing solution is introduced when the movable cup 45 has been moved up and the negative developing solution is introduced when the movable cup 45 has been moved down in the first embodiment of this invention, the negative developing solution may be introduced when the movable cup 45 has been moved up and the positive developing solution may be introduced when the movable cup 45 has been moved down. In this case, the negative developing solution introduced into the outer peripheral flow path 48a in the first embodiment is changed to the positive developing solution and the positive developing solution introduced into the inner peripheral flow path 48b is changed to the negative developing solution. Further, also in the second embodiment of this invention, the negative developing solution may be introduced when the movable cup 45 has been moved up and the positive developing solution may be introduced when the movable cup 45 has been moved down. In this case, the negative developing solution introduced into the outer peripheral flow path 48a and the inner peripheral flow path 48b in the second embodiment is changed to the positive developing solution and the positive developing solution introduced into the inner peripheral flow path 48b is changed to the negative developing solution.

Further, though the case where the two developing treatment apparatuses 50A, 50B are provided in one module has been described in the sixth embodiment, three or more developing treatment apparatuses may be provided in one module.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

What is claimed is:

1. A developing treatment apparatus for performing development by supplying a developing solution to a substrate having a front surface coated with a positive resist or a negative resist and then subjected to exposure, the developing treatment apparatus comprising:
 a substrate holding part that horizontally holds the substrate;
 a rotary drive mechanism that rotates the substrate holding part around a vertical axis;
 a positive developing solution supply nozzle that supplies a developing solution for the positive resist to the front surface of the substrate held by the substrate holding part;
 a negative developing solution supply nozzle that supplies a developing solution for the negative resist to the front surface of the substrate held by the substrate holding part;
 a cup body that is formed in a bottomed circular shape with an upper side open and collects the developing solution scattering with rotation of the substrate;
 a first developing solution drain pipeline that is connected to an outer peripheral side of the cup body and drains one of the developing solutions for the positive resist and the negative resist collected by the cup body;
 a second developing solution drain pipeline that is connected to an inner peripheral side of the cup body and drains another of the developing solutions for the positive resist and the negative resist collected by the cup body;
 a fixed cup that has a peripheral wall between an inner peripheral wall of the cup body and an outer peripheral wall of the cup body and is formed on a lower side of the substrate held by the substrate holding part;
 a movable cup that has a partition between the peripheral wall of the fixed cup and the outer peripheral wall of the cup body, and introduces one of the scattering developing solutions for the positive resist and the negative resist into an inner peripheral flow path surrounded by the partition and the peripheral wall of the fixed cup by raising the partition and introduces another of the scattering developing solutions for the positive resist and the negative resist into an outer peripheral flow path surrounded by the partition and the outer peripheral wall of the cup body by lowering the partition; and
 a control unit that raises the movable cup when using the developing solution for the positive resist and lowers the movable cup when using the developing solution for the negative resist.

2. The developing treatment apparatus according to claim 1,
 wherein the control unit is configured to control the rotary drive mechanism to make a number of rotations of the substrate holding part when using the developing solution for the positive resist larger than a number of rotations of the substrate holding part when using the developing solution for the negative resist.

3. The developing treatment apparatus according to claim 1,
 wherein the fixed cup includes an annular projection for gas/liquid separation that is located between a periphery of the substrate held by the substrate holding part and an opening rim of the movable cup.

4. The developing treatment apparatus according to claim 3,
 wherein the fixed cup has an annular knife edge close to a lower surface of the substrate provided on an inner peripheral side of the annular projection, and a drainage passage that communicates with a bottom of the cup body is formed at a bottom of an annular recessed groove formed between the annular projection and the annular knife edge.

5. The developing treatment apparatus according to claim 1, further comprising:
 a substrate support member, wherein the control unit is configured to control the substrate support member to rise and lower with respect to a substrate holding surface of the substrate holding part, wherein after a positive developing treatment with the developing solution for the positive resist or after a negative developing treatment with the developing solution for the negative resist, the control unit causes the substrate support member to rise to deliver the substrate to a substrate transfer device outside the apparatus and receive a substrate, wherein when the positive developing treatment is performed after the positive developing treatment, the movable cup is lowered after the substrate support member rises to move the substrate after the treatment to a substrate delivery position or at the same time as the movement of the substrate after the treatment to the substrate delivery position, and the movable cup is raised after the substrate support member lowers with the substrate support member having received an untreated substrate or at the same time as the lowering of the substrate support member, wherein when the negative developing treatment is performed after the positive developing treatment, the movable cup is lowered after the substrate support member rises to move the substrate after the treatment to the substrate delivery position or at the same time as the movement of the substrate after the treatment to the substrate delivery position, and wherein when the positive developing treatment is performed after the negative developing treatment, the movable cup is raised after the substrate support member lowers with the substrate support member having received an untreated substrate or at the same time as the lowering of the substrate support member.

6. The developing treatment apparatus according to claim 1, wherein the first developing solution drain pipeline and the second developing solution drain pipeline are provided with respective developing solution pumps and developing solution opening/closing valves, and wherein when the developing solution pump provided on one of the first developing solution drain pipeline and the second developing solution drain pipeline is driven and the developing solution opening/closing valve provided on the one of the first developing solution drain pipeline and the second developing solution drain pipeline is opened, driving of the developing solution pump provided on another of the first developing solution drain pipeline and the second developing solution drain pipeline is stopped and the developing solution opening/closing valve provided on the another of the first developing solution drain pipeline and the second developing solution drain pipeline is closed.

7. The developing treatment apparatus according to claim 1, further comprising:

a positive cleaning solution supply nozzle that supplies a cleaning solution for the positive resist to the front surface of the substrate held by the substrate holding part;

a negative cleaning solution supply nozzle that supplies a cleaning solution for the negative resist to the front surface of the substrate held by the substrate holding part; and a cleaning solution drain pipeline that drains the cleaning solution collected by the cup body that collects the cleaning solution scattering with rotation of the substrate, wherein the cleaning solution drain pipeline is connected to the cup body.

8. The developing treatment apparatus according to claim 7, wherein a connecting part of the first developing solution drain pipeline and a connecting part of the second developing solution drain pipeline which are connected to the cup body are formed to detour upward.

9. The developing treatment apparatus according to claim 7, further comprising:

a cleaning solution supply nozzle that supplies a cleaning solution to the cup body, wherein the cup body is configured to store the cleaning solution supplied from the cleaning solution supply nozzle in the cup body.

10. The developing treatment apparatus according to claim 1, further comprising:

a positive exhaust pipeline provided in an exhaust pipeline that exhausts mist generated due to the developing solution scattering with rotation of the substrate and configured to exhaust gas generated due to the scattering of the developing solution for the positive resist;

a negative exhaust pipeline provided in the exhaust pipeline and configured to exhaust gas generated due to the scattering of the developing solution for the negative resist;

a switching damper provided in the exhaust pipeline and configured to switch connection between the cup body and one of the positive exhaust pipeline and the negative exhaust pipeline; and a damper control unit that controls the switching damper, wherein the damper control unit is configured, when using the developing solution for the positive resist, to move the switching damper to cause the positive exhaust pipeline and the cup body to communicate with each other, and inhibit communication between the negative exhaust pipeline and the cup body, and when using the developing solution for the negative resist, to move the switching damper to cause the negative exhaust pipeline and the cup body to communicate with each other, and inhibit communication between the positive exhaust pipeline and the cup body.

11. A developing treatment method using a developing treatment apparatus for performing development by supplying a developing solution to a substrate having a front surface coated with a positive resist or a negative resist and then subjected to exposure, wherein the developing treatment apparatus comprising:

a substrate holding part that horizontally holds the substrate;

a rotary drive mechanism that rotates the substrate holding part around a vertical axis;

a positive developing solution supply nozzle that supplies a developing solution for the positive resist to the front surface of the substrate held by the substrate holding part;

a negative developing solution supply nozzle that supplies a developing solution for the negative resist to the front surface of the substrate held by the substrate holding part;

a cup body that is formed in a bottomed circular shape with an upper side open and collects the developing solution scattering with rotation of the substrate;

a first developing solution drain pipeline that is connected to an outer peripheral side of the cup body and drains one of the developing solutions for the positive resist and the negative resist collected by the cup body;
a second developing solution drain pipeline that is connected to an inner peripheral side of the cup body and drains another of the developing solutions for the positive resist and the negative resist collected by the cup body;
a fixed cup that has a peripheral wall between an inner peripheral wall of the cup body and an outer peripheral wall of the cup body and is formed on a lower side of the substrate held by the substrate holding part;
a movable cup that has a partition between the peripheral wall of the fixed cup and the outer peripheral wall of the cup body, and introduces one of the scattering developing solutions for the positive resist and the negative resist into an inner peripheral flow path surrounded by the partition and the peripheral wall of the fixed cup by raising the partition and introduces another of the scattering developing solutions for the positive resist and the negative resist into an outer peripheral flow path surrounded by the partition and the outer peripheral wall of the cup body by lowering the partition, and
wherein the movable cup is raised when using the developing solution for the positive resist and the movable cup is lowered when using the developing solution for the negative resist.

* * * * *